(12) United States Patent
Fukuda et al.

(10) Patent No.: US 12,261,184 B2
(45) Date of Patent: Mar. 25, 2025

(54) IMAGE SENSOR AND IMAGE CAPTURING APPARATUS

(71) Applicant: CANON KABUSHIKI KAISHA, Tokyo (JP)

(72) Inventors: Koichi Fukuda, Tokyo (JP); Kohei Okamoto, Kanagawa (JP); Shunichi Wakashima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 216 days.

(21) Appl. No.: 17/496,955

(22) Filed: Oct. 8, 2021

(65) Prior Publication Data

US 2022/0028914 A1 Jan. 27, 2022

Related U.S. Application Data

(63) Continuation of application No. PCT/JP2020/016448, filed on Apr. 14, 2020.

(30) Foreign Application Priority Data

Apr. 15, 2019 (JP) .................................. 2019-077356
Apr. 8, 2020 (JP) .................................. 2020-070011

(51) Int. Cl.
H01L 27/146 (2006.01)
G02B 3/00 (2006.01)
(Continued)

(52) U.S. Cl.
CPC ...... H01L 27/14627 (2013.01); G02B 3/0056 (2013.01); G03B 13/32 (2013.01);
(Continued)

(58) Field of Classification Search
None
See application file for complete search history.

(56) References Cited

U.S. PATENT DOCUMENTS 4,410,804 A 10/1983 Stauffer
9,935,146 B1 * 4/2018 Lee ................... H01L 27/14689
(Continued)

FOREIGN PATENT DOCUMENTS

CN 1862823 A 11/2006
CN 105556672 A 5/2016
(Continued)

OTHER PUBLICATIONS

Apr. 29, 2023 Chinese Office Action, with an English Translation, that issued in Chinese Patent Application No. 202080028678.4.
(Continued)

Primary Examiner — Twyler L Haskins
Assistant Examiner — Wesley J Chiu
(74) Attorney, Agent, or Firm — Cowan, Liebowitz & Latman, P.C.

(57) ABSTRACT

In an image sensor having a plurality of pixels including focus detection pixels that outputs signals from which a pair of focus detection signals having parallax can be obtained based on light flux passing through different pupil regions of an imaging optical system, each pixel comprises: at least one photoelectric conversion unit; and a microlens optical system provided on a side on which light is incident with respect to the photoelectric conversion unit, wherein a shape of a principal curved surface of the microlens optical system is such that a first curvature of the microlens optical system at a first distance from an optical axis of the microlens optical system is larger than a second curvature of the microlens optical system at a second distance which is farther from the optical axis of the microlens optical system than the first distance.

12 Claims, 13 Drawing Sheets

(51) Int. Cl.
  *G03B 13/32* (2021.01)
  *H04N 23/55* (2023.01)
  *H04N 23/67* (2023.01)
  *H04N 23/80* (2023.01)
  *H04N 25/704* (2023.01)

(52) U.S. Cl.
  CPC ........... *H04N 23/55* (2023.01); *H04N 23/671* (2023.01); *H04N 23/80* (2023.01); *H04N 25/704* (2023.01); *H01L 27/1464* (2013.01)

(56) References Cited

U.S. PATENT DOCUMENTS

| | | | | |
|---|---|---|---|---|
| 2009/0224348 | A1* | 9/2009 | Matsushita | H01L 27/14627 257/E31.127 |
| 2011/0076001 | A1 | 3/2011 | Iwasaki | |
| 2011/0273581 | A1* | 11/2011 | Fujii | H04N 25/704 348/222.1 |
| 2015/0062390 | A1* | 3/2015 | Kim | H01L 27/14621 348/273 |
| 2015/0102442 | A1 | 4/2015 | Ootsuka | |
| 2015/0350529 | A1* | 12/2015 | Kato | H01L 27/1464 348/345 |
| 2016/0248967 | A1* | 8/2016 | Sasaki | G01C 3/06 |
| 2016/0286108 | A1* | 9/2016 | Fettig | H04N 25/704 |
| 2017/0180628 | A1* | 6/2017 | Kato | H04N 25/704 |

FOREIGN PATENT DOCUMENTS

| | | |
|---|---|---|
| CN | 105872322 A | 8/2016 |
| CN | 208538863 U | 2/2019 |
| JP | 2000-156823 A | 6/2000 |
| JP | 2001-083407 A | 3/2001 |
| JP | 2012-059845 A | 3/2012 |
| JP | 2014-086471 A | 5/2014 |
| JP | 2014-154662 A | 8/2014 |
| JP | 2015-167219 A | 9/2015 |
| JP | 2018-132581 A | 8/2018 |

OTHER PUBLICATIONS

International Search Report dated Jul. 9, 2020 of the corresponding International Application, PCT/JP2020/164481 filed Apr. 14, 2020.
European Search Report issued on Nov. 21, 2022, that issued in the corresponding European Patent Application No. 20791352.6.
Jun. 14, 2024 Japanese Office Action, a copy of which is enclosed without an English Translation, that issued in Japanese Patent Application No. 2020-070011.

\* cited by examiner

F I G. 2
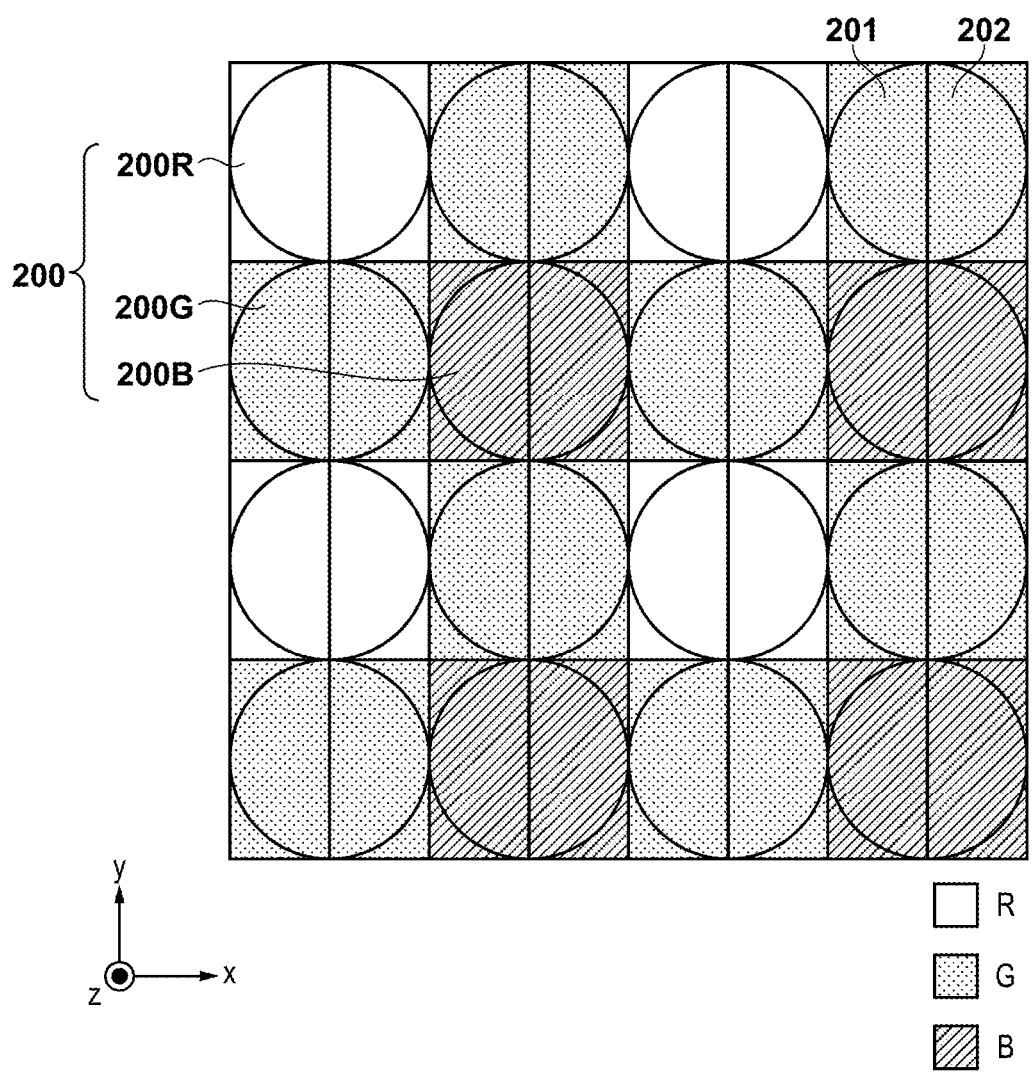

IMAGE SENSOR AND IMAGE CAPTURING APPARATUS

CROSS-REFERENCE TO RELATED APPLICATIONS

This application is a Continuation of International Patent Application No. PCT/JP2020/016448, filed Apr. 14, 2020, which claims the benefit of Japanese Patent Application No. 2019-077356, filed Apr. 15, 2019 and No. 2020-070011, filed Apr. 8, 2020, both of which are hereby incorporated by reference herein in their entirety.

BACKGROUND OF THE INVENTION

Field of the Invention

The present invention relates to an image sensor and an image capturing apparatus.

Background Art

Focus detection methods performed by an image capturing apparatus includes an on-imaging plane phase difference method in which phase difference focus detection is performed using focus detection pixels formed on an image sensor.

Patent Document 1 discloses an image capturing apparatus that uses a two-dimensional image sensor composed of a plurality of pixels each including one microlens and a plurality of photoelectric conversion units. The plurality of photoelectric conversion units are configured to receive light transmitted through different regions of an exit pupil of an imaging lens unit via the one microlens, thereby realizing the pupil division. The phase difference focus detection can be performed by calculating a correlation amount from focus detection signals output from each pixel (focus detection pixel) having such a plurality of photoelectric conversion units, and obtaining an image shift amount from the calculated correlation amount. Further, Patent Document 2 discloses that an image signal is generated by adding focus detection signals output from a plurality of photoelectric conversion units of each pixel.

Further, Patent Document 3 discloses an image sensing apparatus in which pairs of focus detection pixels are partially arranged on a two-dimensional image sensing element composed of a plurality of imaging pixels. Each pair of focus detection pixels is configured to receive light from different regions of an exit pupil of the photographing lens through openings of a light-shielding layer, thereby pupil division is performed. Image signals are acquired from the imaging pixels arranged in most part of the two-dimensional image sensing element. On the other hand, a correlation amount is calculated from focus detection signals from the focus detection pixels arranged in a part of the two-dimensional image sensing element, and the image shift amount is obtained from the calculated correlation amount to realize the phase difference focus detection.

Thus, in the on-imaging plane phase difference focus detection, since the defocus direction and the defocus amount can be detected at the same time using the focus detection pixels formed on an image sensor, it is possible to adjust the focus at high speed.

CITATION LIST

Patent Literature

PTL1 U.S. Pat. No. 4,410,804
PTL2 Japanese Patent Laid-Open No. 2001-083407
PTL3 Japanese Patent Laid-Open No. 2000-156823

However, the curvature of a microlens for improving pupil division ability to improve focus detection performance of the on-imaging plane phase difference focus detection and the curvature of a microlens for suppressing crosstalk between pixels to improve imaging performance do not always match.

The present invention has been made in consideration of the above problem, and the object of the present invention is to suppress crosstalk between pixels while maintaining focus detection performance.

SUMMARY OF THE INVENTION

In order to achieve the above object, in an image sensor having a plurality of pixels including focus detection pixels that output signals from which a pair of focus detection signals having parallax can be obtained based on light flux passing through different pupil regions of an imaging optical system, each pixel comprises: at least one photoelectric conversion unit; and a microlens optical system provided on a side on which light is incident with respect to the photoelectric conversion unit, wherein a shape of a principal curved surface of the microlens optical system is such that a first curvature of the microlens optical system at a first distance from an optical axis of the microlens optical system is larger than a second curvature of the microlens optical system at a second distance which is farther from the optical axis of the microlens optical system than the first distance.

It is another aspect to achieve the above object that, in an image sensor having a plurality of pixels including focus detection pixels that outputs signals from which a pair of focus detection signals having parallax can be obtained based on light flux passing through different pupil regions of an imaging optical system, each pixel comprising: at least one photoelectric conversion unit; and a microlens optical system provided on a side on which light is incident with respect to the photoelectric conversion unit, wherein a shape of a principal curved surface of the microlens optical system is such that a first focal point of a circular portion of the microlens optical system with the radius of a first distance from an optical axis of the microlens optical system is located on the side where the light enters with respect to a second focal point of a circular portion of the microlens optical system with the radius of a second distance which is farther from the optical axis of the microlens optical system than the first distance.

Further, it is another aspect of the present invention to achieve the above object that an image capturing apparatus comprising: either of the image sensors as described above; the imaging optical system; and a processing unit that processes signals output from the image sensor is provided.

Furthermore, it is another aspect of the present invention to achieve the above object that image capturing apparatus to/from which an imaging optical system can be attached/detached, comprising: either of the image sensors as described above; and a processing unit that processes signals output from the image sensor is provided.

Further features of the present invention will become apparent from the following description of exemplary embodiments with reference to the attached drawings.

BRIEF DESCRIPTION OF THE DRAWINGS

FIG. 2 A schematic view showing an example of a pixel array according to a first embodiment.

DESCRIPTION OF THE EMBODIMENTS

Figure 1:
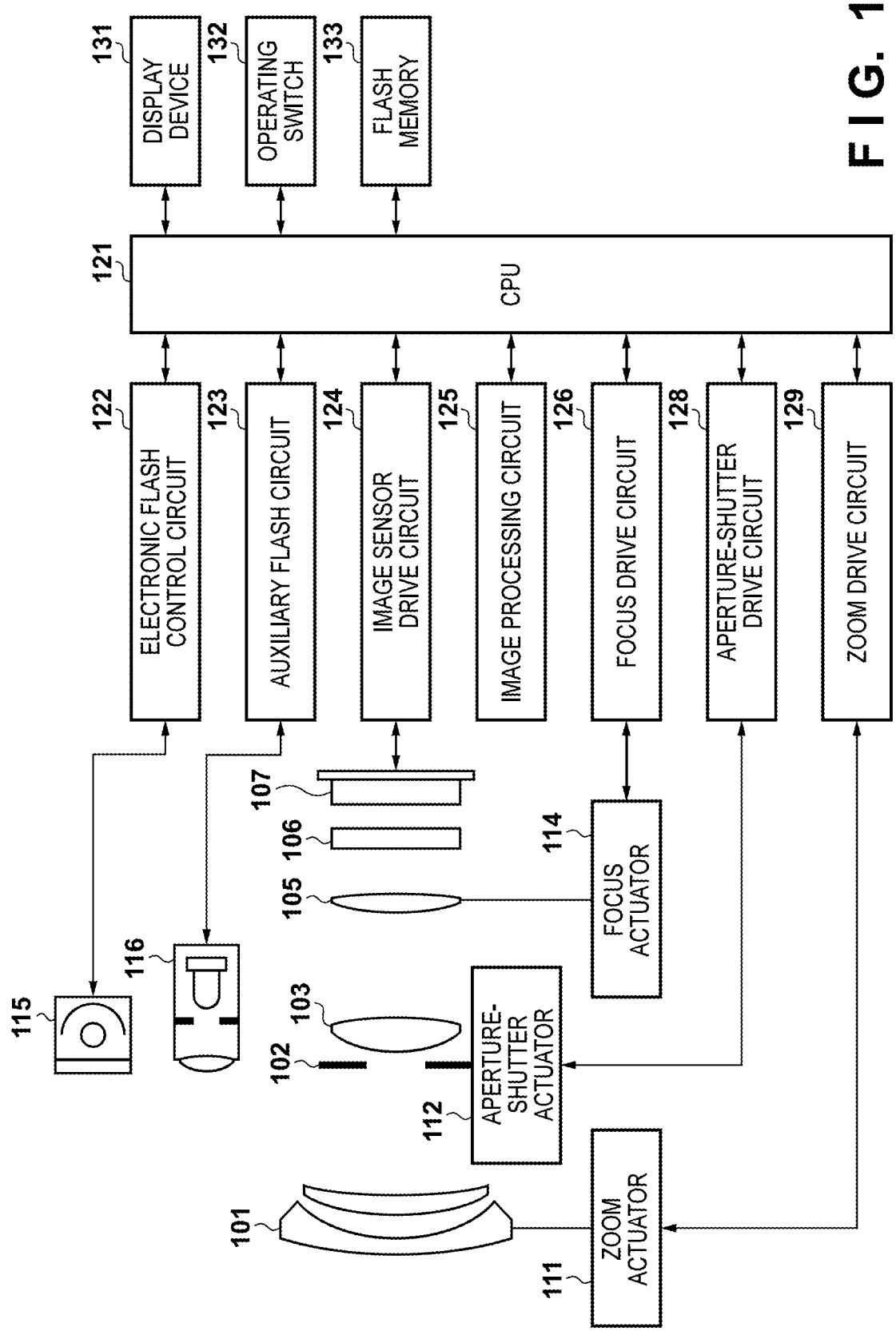
FIG. 1 A block diagram showing a schematic configuration of an image capturing apparatus according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made on an invention that requires all such features, and multiple such features may be combined as appropriate. Furthermore, in the attached drawings, the same reference numerals are given to the same or similar configurations, and redundant description thereof is omitted.

First Embodiment

[Overall Configuration]

FIG. 1 is a diagram showing a schematic configuration of a camera as an example of an image capturing apparatus having an image sensor according to an embodiment of the present invention. In FIG. 1, a first lens group 101 is disposed on the front end of an imaging optical system, and supported so as to be movable forward and backward along an optical axis. An aperture-shutter (diaphragm) 102 adjusts the diameter of its opening, thereby adjusting the amount of light during image sensing, and also has a function to adjust the exposure time during still image sensing. The aperture-shutter 102 and a second lens group 103 move together forward and backward along the optical axis, and, in conjunction with the forward and backward movement of the first lens group 101, provide a magnification change effect (a zoom function).

A third lens group 105 (focus lens) carries out focus adjustment by moving forward and backward along the optical axis. An optical low-pass filter 106 is an optical element for reducing false color and moiré of a sensed image. An image sensor 107 is composed of a two-dimensional CMOS photo sensor and peripheral circuits, and disposed on an imaging plane of the imaging optical system.

A zoom actuator 111 carries out a magnification-change operation by rotation of a cam barrel, not shown, to move the first lens group 101 through the second lens group 103 forward and backward along the optical axis. An aperture-shutter actuator 112 controls the diameter of the opening of the aperture-shutter 102 and adjusts the amount of light for image sensing, and also controls the exposure time during still image sensing. A focus actuator 114 moves the third lens group 105 forward and backward along the optical axis to adjust the focus.

As an electronic flash 115 for illuminating an object during image sensing, a flash illumination device that uses a Xenon tube is preferable, but an illumination device comprised of a continuous-flash LED may also be used. An AF auxiliary flash unit 116 projects an image of a mask having a predetermined opening pattern onto an object field through a projective lens to improve focus detection performance for dark objects and low-contrast objects.

A CPU 121 within the image capturing apparatus controls the camera main unit in various ways. The CPU 121 may, for example, have a calculation unit, ROM, RAM, A/D converter, D/A converter, communication interface circuitry, and so forth. In addition, the CPU 121, based on predetermined programs stored in the ROM, drives various circuits that the camera has, and executes a set of operations of AF, image sensing, image processing, and recording.

An electronic flash control circuit 122 controls firing of the electronic flash 115 in synchrony with an image sensing operation. An auxiliary flash circuit 123 controls firing of the AF auxiliary flash unit 116 in synchrony with a focus detection operation. An image sensor drive circuit 124 controls the image sensing operation of the image sensor 107, A/D-converts acquired image signals, and transmits the converted image signals to the CPU 121. An image processing circuit 125 performs processing such as conversion, color interpolation, JPEG compression and the like on image signals obtained from signals read out from the image sensor 107.

A focus drive circuit 126 controls the drive of the focus actuator 114 based on the focus detection result to drive the third lens group 105 forward and backward in the optical axis direction, thereby performing focus adjustment. An aperture-shutter drive circuit 128 controls the drive of the aperture-shutter actuator 112, thereby controlling the opening of the aperture-shutter 102. A zoom drive circuit 129 drives the zoom actuator 111 in accordance with a zoom operation by a user.

A display device 131, such as an LCD, displays information relating to the image sensing mode of the camera, preview images before image sensing, confirmation images after image sensing, and focus state display images during focus detection, and so forth. An operating switch group 132 is composed of a power switch, a release (image sensing trigger) switch, a zoom operation switch, an image sensing mode selection switch, and so on. A detachable flash memory 133 records captured images.

[Image Sensor]

FIG. 2 shows the outline of an array of imaging pixels and focus detection pixels of the image sensor 107 according to the first embodiment. FIG. 2 illustrates the pixel (imaging pixel) array within the range of 4 columns×4 rows, or the focus detection pixel array within the range of 8 columns×4 rows in the two-dimensional CMOS sensor (image sensor) of back-side illumination type as the image sensor 107 of the first embodiment.

A pixel group 200 includes pixels of 2 columns×2 rows, and a pixel 200R having a spectral sensitivity of R (red) is arranged at the upper left position, pixels 200G having a spectral sensitivity of G (green) are arranged at the upper right and lower left positions, and a pixel 200B having a spectral sensitivity of B (blue) is arranged at the lower right position. Each pixel is formed from a first focus detection pixel 201 and a second focus detection pixel 202 arrayed in 2 columns×1 row.

A large number of arrays of 4 columns×4 rows of pixels (8 columns×4 rows of focus detection pixels) shown in FIG. 2 are arranged on a plane to enable capture of an image (focus detection signals).

Figure 3:
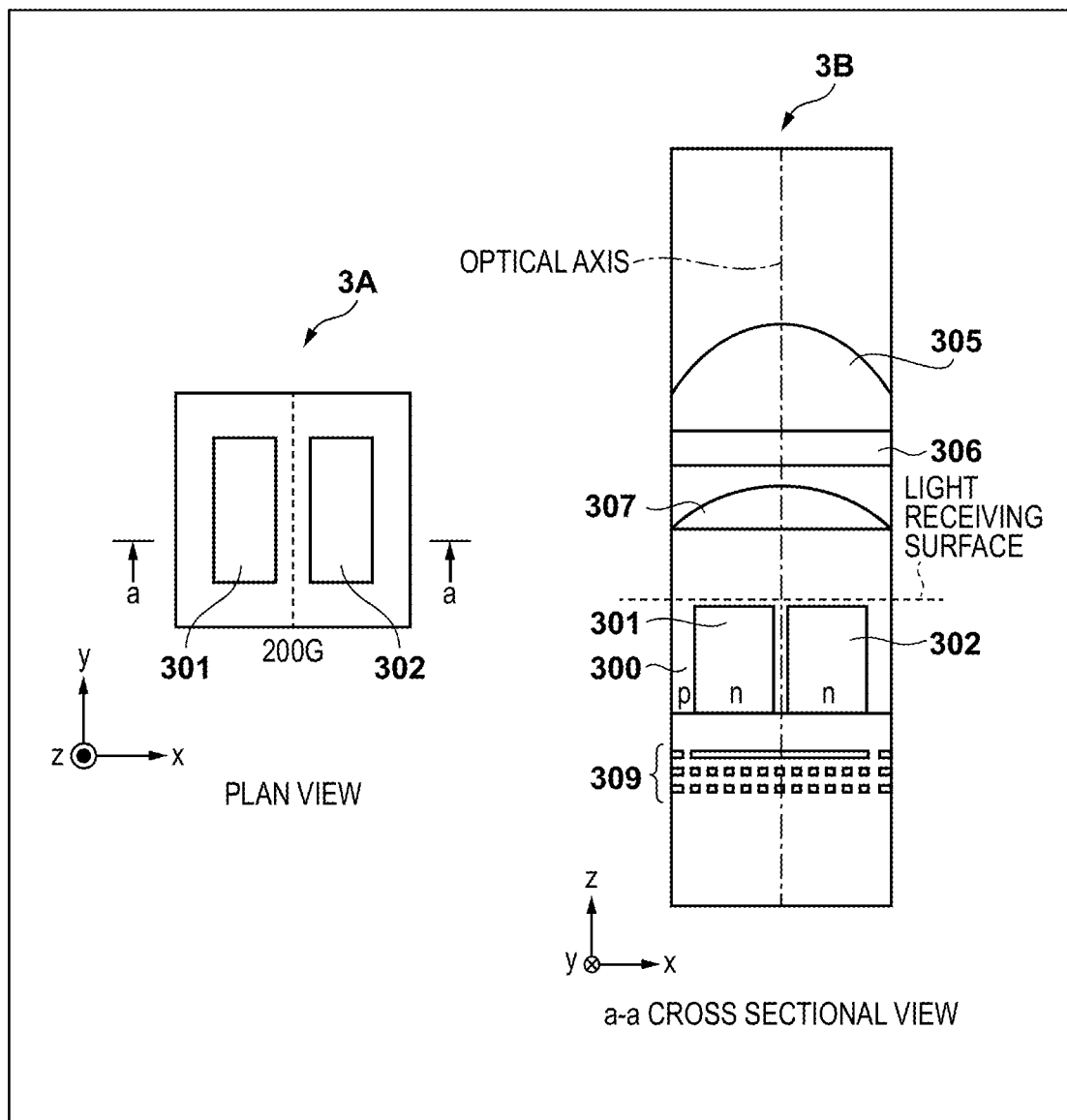
FIG. 3 A schematic plan view and a schematic cross-sectional view of a pixel according to the first embodiment.

3A of FIG. 3 is a plan view of one pixel 200G of the image sensor 107 shown in FIG. 2 when viewed from the light receiving surface side (+z side) of the image sensor 107, and 3B of FIG. 3 is a cross-sectional view taken along an a-a line in 3A viewed from the −y side. As shown in FIG. 3, in the pixel 200G according to this embodiment, a microlens 305 and an intralayer lens 307 for converging incident light is formed on the light receiving side of each pixel. Photoelectric conversion units 301 and 302 that divide the pixel by NH (here, divided by two) in the x direction and by NV (here, divided by one, or not divided) in the y direction are formed. The photoelectric conversion units 301 and 302 correspond to the first focus detection pixel 201 and the second focus detection pixel 202, respectively.

Each of the photoelectric conversion units 301 and 302 may be formed as a p-n junction photodiode configured with a p-type layer and an n-type layer, or may be formed as a pin structure photodiode including an intrinsic layer between a p-type layer and an n-type layer, as needed.

The pixel 200G is provided with a color filter 306 between the microlens 305 and the intralayer lens 307. The spectral transmittance of the color filter 306 may be changed for each pixel or each photoelectric conversion unit as needed. Moreover, the color filter may be omitted.

In the pixel 200G of the present embodiment, a microlens optical system composed of the microlens 305, an intralayer lens 307, a color filter 306, a planarizing layer, a sealing layer, an insulating layer, and so forth, is formed on the light receiving side. Further, in the present embodiment, a wiring layer 309 is formed on the side opposite to the microlens 305 and the intralayer lens 307, that is, on the side opposite to the light incident side, with respect to the photoelectric conversion units 301 and 302.

The light incident on the pixel 200G shown in FIG. 3 is converged by the microlens 305, filtered by the color filter 306, further converged by the intralayer lens 307, then received by the photoelectric conversion units 301 and 302. In the photoelectric conversion units 301 and 302, pairs of electrons and holes are produced according to the amount of light received, and after being separated by a depletion layer, negatively charged electrons are accumulated in the n-type layer (not shown), while the holes are discharged to the outside of the image sensor 107 through the p-type layer connected to a constant voltage source (not shown). The electrons stored in the n-type layer (not shown) of the photoelectric conversion units 301 and 302 are transferred to a capacitance section (FD) via transfer gates, converted into voltage signals, and output.

The pixels 200R and 200B shown in FIG. 2 also have the same configuration as the pixel 200G, and output voltage signals corresponding to the light of different colors extracted by the color filters 306 in the same manner as the pixel 200G.

In each pixel having such a configuration, a signal (A+B signal) obtained by adding signals from photoelectric conversion units 301 and 302 is used as an imaging signal, and two signals (A signal and B signal) read from the photoelectric conversion units 301 and 302, respectively, are used as a pair of focus detection signals. The imaging signal and the focus detection signals may be read out independently, but the following method may be used in consideration of the processing load. That is, the imaging signal (A+B signal) and the focus detection signal (for example, A signal) of either of the photoelectric conversion units 301 and 302 are read out, and the other focus detection signal having parallax (for example, B signal) is acquired by taking the difference between the imaging signal and the focus detection signal (for example, A signal).

Then, by collecting the plurality of A signals and the plurality of B signals output from the plurality of pixels, a pair of image signals used in the on-imaging plane phase difference detection AF is obtained. Then, the image signals of the pair are superposed while shifting their relative positions, and at each shifted position, a correlation calculation of obtaining an area (correlation amount) of the different portion between the waveforms, for example, is performed. The shifted position where the correlation amount is the smallest, that is, the phase difference (image shift amount) which represents the most correlated shift amount, is obtained, and the defocus amount and defocus direction of the imaging optical system are further calculated from the calculated image shift amount.

Although the above-mentioned example shows an example in which the pupil region is divided into two in the horizontal direction, the pupil region may be divided in the vertical direction as needed.

Further, in the above-described example, a plurality of imaging pixels each composed of the first focus detection pixel and the second focus detection pixel are arranged, but the present invention is not limited to this. The imaging pixel, the first focus detection pixel, and the second focus detection pixel are formed as different pixels, and the first focus detection pixels and the second focus detection pixels may be arranged in a part of an array of the imaging pixels, as needed.

The configuration of the image sensor 107 is not limited to the configuration described above, and may be any configuration as long as the configuration has focus detection pixels capable of outputting signals from which pairs of focus detection signals having parallax can be acquired based on the subject light passing through different pupil regions of the imaging optical system.

[Pupil Division]

Next, the pupil division function of the image sensor 107 of the present embodiment will be described with reference to FIGS. 4 to 6. Since the pixels 200R, 200G, and 200B have the same configuration, the pixel 200G will be described below as a representative.

Figure 4:
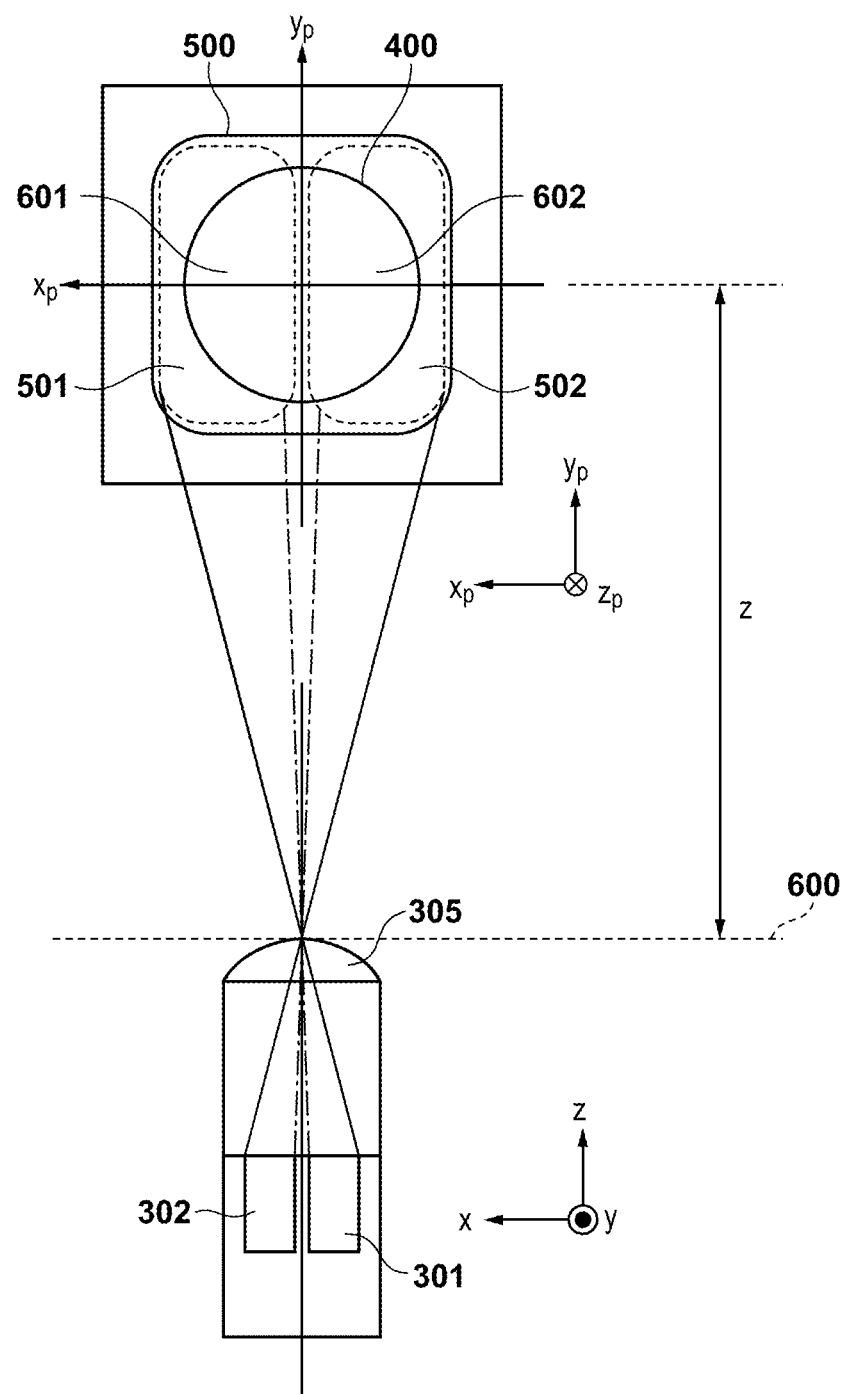
FIG. 4 A schematic explanatory view of a pixel structure and pupil division according to the first embodiment.
Figure 5:
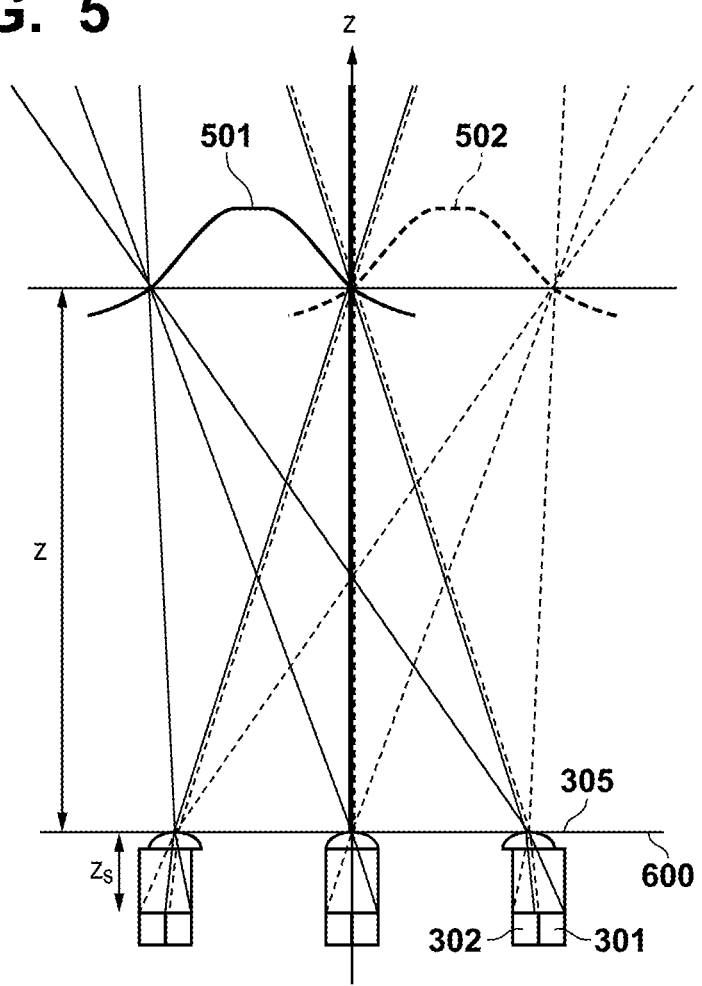
FIG. 5 A schematic view illustrating the correspondence between an image sensor and a pupil intensity distribution according to the first embodiment.

FIG. 4 illustrates a cross-sectional view taken along the a-a line of the pixel 200G arranged in the image sensor 107 shown in 3A of FIG. 3A viewed from the +y side and a pupil plane located at a distance Z from an imaging surface 600 of the image sensor 107 in the z axis direction (optical axis direction). Note that in FIG. 4, in order to achieve correspondence between the coordinate axes of the pupil plane and the coordinate axes of the cross-sectional view, the x- and y-axes of the cross-sectional view are reversed with respect to those of FIG. 3. The imaging surface 600 of the image sensor 107 is arranged on the imaging plane of the imaging optical system.

A first partial pupil region 501 corresponds to the first focus detection pixel 201 and is almost conjugate with the light receiving surface of the photoelectric conversion unit 301, whose center of gravity is decentered in the −x direction, via the microlens optical system configured with the microlens 305, the intralayer lens 307, and the like. Therefore, the first partial pupil region 501 represents the pupil region that passes light which can be received by the first focus detection pixel 201. The center of gravity of the first partial pupil region 501 is decentered to the +xp side on the pupil surface.

Similarly, a second partial pupil region 502 corresponds to the second focus detection pixel 202 and is almost conjugate with the light receiving surface of the photoelectric conversion unit 302, whose center of gravity is decentered in the +x direction, via the microlens optical system configured with the microlens 305, the intralayer lens 307, and the like. Therefore, the second partial pupil region 502 represents the pupil region that passes light which can be received by the second focus detection pixel 202. The center of gravity of the second partial pupil region 502 is decentered to the −xp side on the pupil surface.

Further, a pupil region 500 is a pupil region that passes light which can be received by the entire pixel 200G with the photoelectric conversion units 301 and 302 (the first focus detection pixel 201 and the second focus detection pixel 202) being combined. Reference numeral 400 denotes an opening of the aperture-shutter 102.

Next, the entrance pupil of the image sensor 107 will be described with reference to FIG. 5. In the image sensor 107 of the present embodiment, the microlenses 305 and the intralayer lenses 307 (not shown) of pixels located at different image height coordinates on the surface are continuously shifted toward the center of the image sensor 107 with respect to the photoelectric conversion units 301 and 302 depending on the image height coordinates of the respective pixels. As a result, in the pupil plane located at the distance Z from the imaging surface 600 of the image sensor 107, the first partial pupil region 501 corresponding to the light receiving region of the first focus detection pixel 201 is substantially the same for the pixels arranged at different image height coordinates of the image sensor 107. Similarly, the second partial pupil region 502 corresponding to the light receiving region of the second focus detection pixel 202 is substantially the same for the pixels. That is, the first partial pupil region 501 and the second partial pupil region 502 on the pupil plane located at the distance Z from the imaging surface 600 of the image sensor 107 are substantially the same for all the pixels of the image sensor 107. Hereinafter, the first partial pupil region 501 and the second partial pupil region 502 will be referred to as the "sensor entrance pupil" of the image sensor 107, and the distance Z will be referred to as the "entrance pupil distance" of the image sensor 107.

Figure 6:
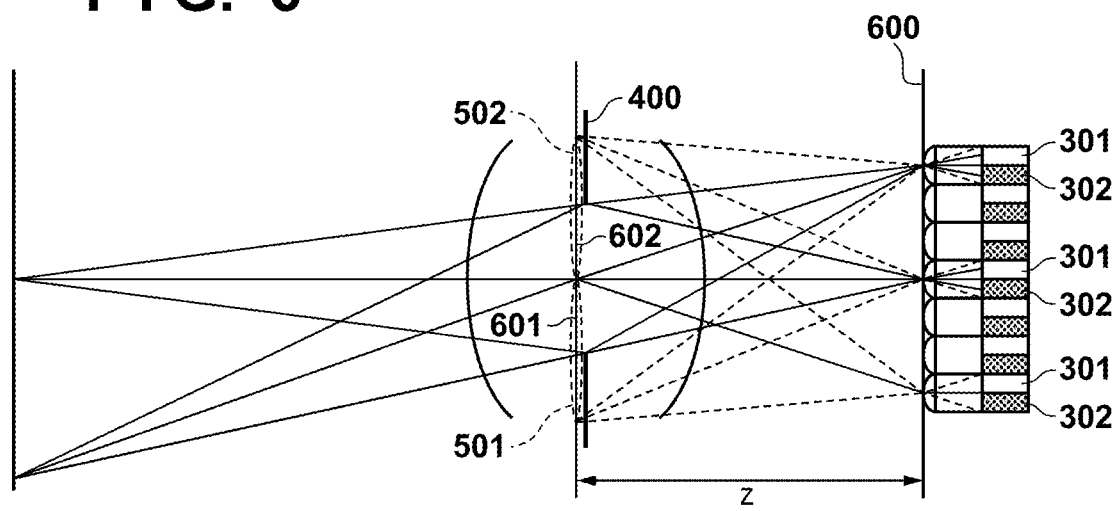
FIG. 6 A schematic view for illustrating pupil division of an exit pupil according to the first embodiment.

FIG. 6 is a schematic view for explaining the optical division (pupil division) of the exit pupil 400 of the imaging optical system caused by the sensor entrance pupil of the image sensor 107 of the present embodiment. Of the light flux from a subject, the light flux that has passed through a first exit pupil region 601, which is the overlapping region of the exit pupil 400 of the imaging optical system and the first partial pupil region 501, is received by the first focus detection pixel 201 (photoelectric conversion unit 301). Similarly, of the light flux from the subject, the light flux that has passed through a second exit pupil region 602, which is the overlapping region of the exit pupil 400 of the imaging optical system and the second partial pupil region 502, is received by the second focus detection pixel 202 (photoelectric conversion unit 302).

FIG. 4 shows the first exit pupil region 601 and the second exit pupil region 602 in the pupil plane located at the entrance pupil distance Z of the image sensor 107. That is, it is shown that the exit pupil 400 of the imaging optical system is divided into the first exit pupil region 601 and the second exit pupil region 602 by the sensor entrance pupils of the image sensor 107.

[Crosstalk Between Pixels]

The light incident on the pixel 200G is converged on the focal point by the microlens optical system. However, because of the influence of diffraction due to the wave nature of light, the diameter of the focused spot cannot be made smaller than the diffraction limit Δ, and has a finite size. The size of the light receiving surface of the photoelectric conversion unit is about 1 to 2 μm, whereas the size of the focused spot of the microlens is about 1 μm. Therefore, the first partial pupil region 501 and the second partial pupil region 502 in FIG. 4, which are in a conjugated relationship with the light receiving surface of the photoelectric conversion unit via the microlens, are not clearly pupil-divided due to diffraction blur, and the light receiving rate distribution (pupil intensity distribution) depends on the angle of incidence of light.

Figure 7:
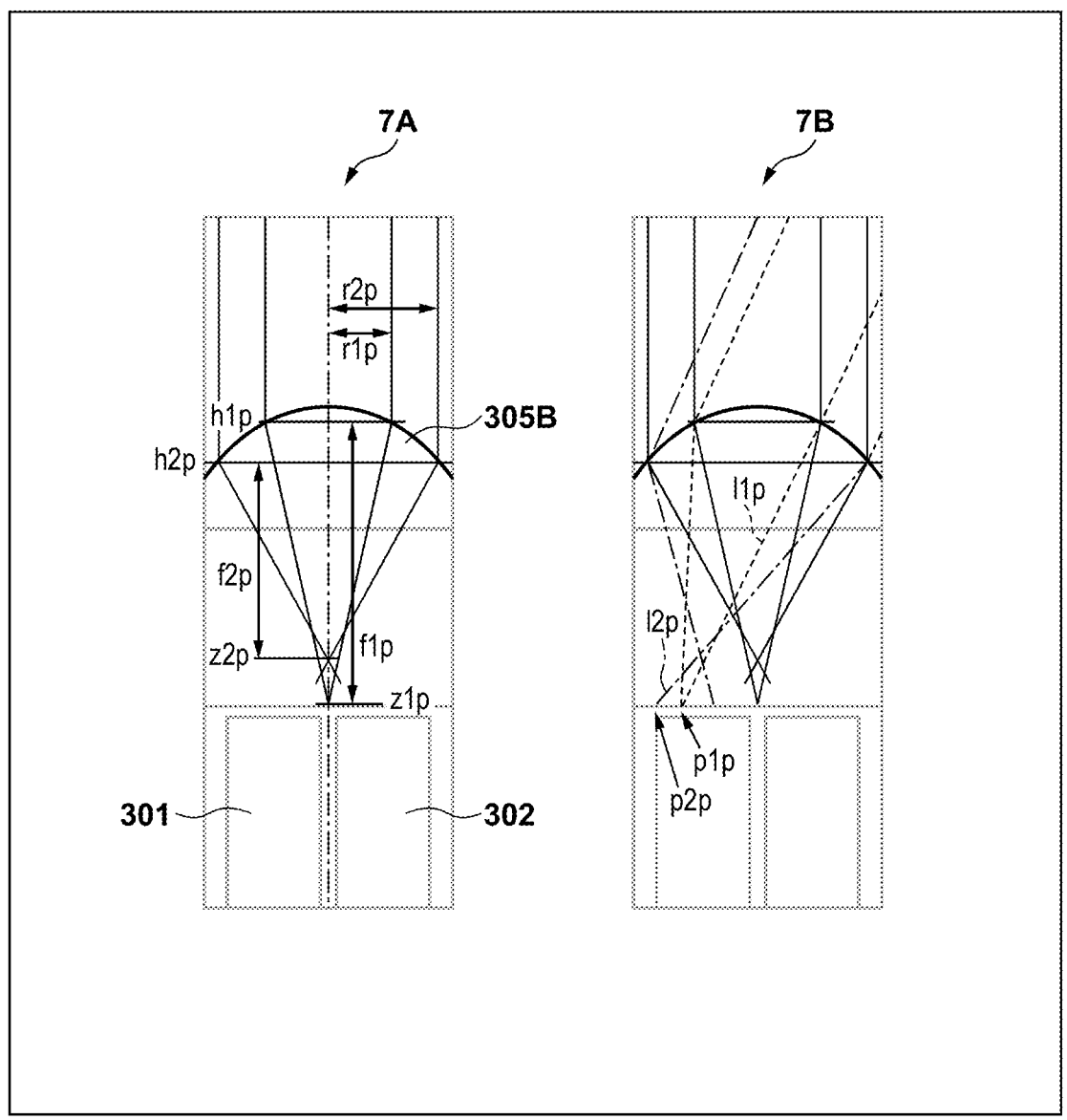
FIG. 7 A diagram illustrating inter-pixel crosstalk between conventional pixels.

Here, the inter-pixel crosstalk generated in the back-side illuminated image sensor will be described with reference to FIG. 7. FIG. 7 is a diagram showing pixels of a conventional image sensor, in which a microlens 305B has a constant curvature regardless of the distance from its optical axis. Also, no intralayer lens is formed. In the image sensor shown in FIG. 7, the same reference numerals are given to the same configurations as the pixels of the embodiment shown in FIG. 3, and the description thereof will be omitted.

7A of FIG. 7 shows a state in which light incident on the microlens 305B at an angle parallel to the optical axis is converged by the spherical microlens 305B having the constant curvature. Further, 7B in FIG. 7 shows a state in which light incident on the microlens 305B at an angle of 25° with respect to the optical axis is converged by the spherical microlens 305B having the constant curvature.

In 7A, a first distance from the optical axis of the spherical microlens 305B is denoted by r1$p$, and a second distance from the optical axis of the spherical microlens 305B is denoted by r2$p$. The first distance r1$p$ is shorter than the second distance r2$p$, and, on the radial coordinates perpendicular to the optical axis of the spherical microlens 305B, a point at the first distance r1$p$ is located inside of a point at the second distance r2$p$. With respect to the first distance r1$p$, a point on the spherical microlens 305B is referred to as the first principal point h1$p$, the focal length is referred to as the first focal length f1$p$, and the focal point is referred to as the first focal point z1$p$. Further, with respect to the second distance r2$p$, a point on the spherical microlens 305B is referred to as the second principal point h2$p$, the focal length is referred to as the second focal length f2$p$, and the focal point is referred to as the second focal point z2$p$.

In 7A, since the spherical microlens 305B has a constant curvature, the second focal length f2$p$ corresponding to the second distance r2p is shorter than the first focal length f1p corresponding to the first distance r1p. Further, the second focal point z2p corresponding to the second distance r2p is located relatively closer to the light receiving side than the first focal point z1p corresponding to the first distance r1p.

Therefore, when light is incident on the spherical microlens 305B at an angle of 25° with respect to the optical axis as shown in 7B, an incident point p2p of a light ray l2p from a point at the second distance r2p on the light receiving surface of the photoelectric conversion unit is closer to the adjacent pixel than an incident point p1p of a light ray l1p from a point at the first distance r1p on the light receiving surface of the photoelectric conversion unit. In addition to this, the angle between the light ray l2p from the point at the second distance r2p and the light receiving surface of the photoelectric conversion unit is smaller (larger, with respect to the vertical axis of the light receiving surface) than the angle between the light ray l1p from the point at the first distance r1p and the light receiving surface of the photoelectric conversion unit.

Therefore, the spherical microlens 305B of each pixel has a shape that easily causes crosstalk to adjacent pixels with respect to obliquely incident light, and the imaging performance may deteriorate. Accordingly, in the conventional image sensor, in order to improve the focus detection performance, if the curvature of the microlens is made small, the focal length is made long, and the change in the incident angle of the pupil intensity distribution of the focus detection pixel is made large, inter-pixel crosstalk between the imaging pixels may occur and the imaging performance may deteriorate.

In view of the above phenomenon, in the present embodiment, the microlens optical system provided in each pixel is configured to meet the conditions described below so that the inter-pixel crosstalk of the imaging pixels is suppressed.

[Microlens Optical System]

The microlens optical system provided for each pixel of the image sensor 107 in the first embodiment will be described with reference to FIGS. 8 to 10. As described above, the microlens optical system of each pixel in the present embodiment is composed of the microlens 305, the planarizing layer, the color filter 306, the intralayer lens 307, the sealing layer, the insulating layer, and the like. Further, the pixel structure shown in FIG. 8 corresponds to the pixel structure shown in FIG. 3.

Figure 8:
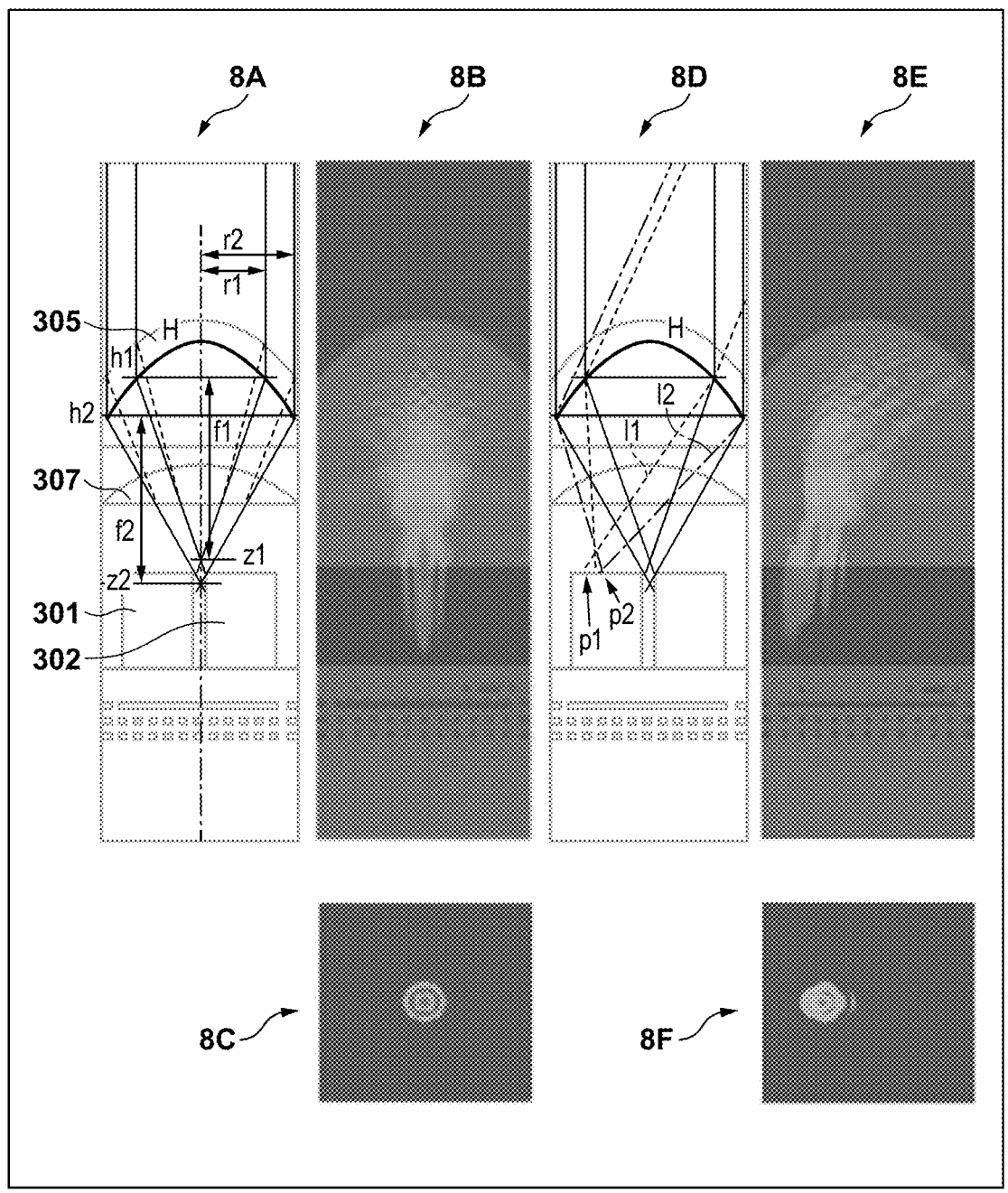
FIG. 8 A diagram for explaining a correspondence between a microlens optical system provided on a pixel and a converged state of light according to the first embodiment.

8A to 8C of FIG. 8 show a state in which light incident on a pixel of the present embodiment at an angle parallel to the optical axis is converged by the microlens optical system provided on the light receiving side of the photoelectric conversion units 301 and 302. Further, 8D to 8F of FIG. 8 show a state in which light incident on a pixel of the present embodiment at an angle of 25° with respect to the optical axis is converged by the microlens optical system provided on the light receiving side of the photoelectric conversion units 301 and 302.

In 8A and 8D of FIG. 8, a curve H shown by a bold line indicates a principal curved surface H (cross section) of the microlens optical system provided in the pixel of the present embodiment, and the microlens optical system is optically equivalent to a single microlens having the principal curved surface H. Therefore, the pixel of the present embodiment is substantially optically equivalent to a pixel structure in which a single microlens having the principal curved surface H is provided on the light receiving side of the photoelectric conversion units 301 and 302.

In 8A, a first distance from the optical axis of the microlens optical system is denoted by r1, and a second distance from the optical axis of the microlens optical system is denoted by r2. The first distance r1 is shorter than the second distance r2, and, on the radial coordinates with the optical axis of the microlens optical system being the center, a position at the first distance r1 is located inside of a position at the second distance r2. Further, with respect to the first distance r1, a point on the principal curved surface H of the microlens optical system is referred to as a first principal point h1, the focal length is referred to as a first focal length f1, and the focal point is referred to as a first focal point z1. Furthermore, with respect to the second distance r2, a point on the principal curved surface of the microlens optical system is referred to as a second principal point h2, the focal length is referred to a second focal length f2, and the focal point is referred to as a second focal point z2.

Figure 9:
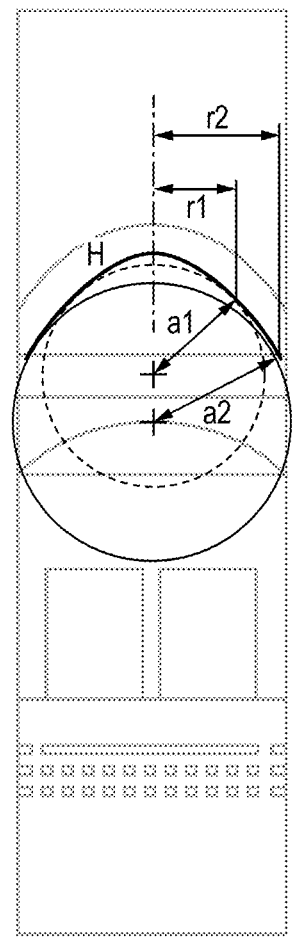
FIG. 9 A diagram for explaining a correspondence between a principal curved surface and the radius of curvature of the microlens optical system provided on the pixel according to the first embodiment.

FIG. 9 shows a circle in contact with the principal curved surface H (cross section) of the microlens optical system provided in the pixels of the present embodiment shown in 8A and 8D in FIG. 8. The radius of the circle in contact with the principal curved surface H at the first distance r1 is defined as a first curvature radius a1, and the radius of the circle in contact with the principal curved surface H at the second distance r2 is defined as a second curvature radius a2. In the present embodiment, the first curvature radius a1 corresponding to the first distance r1 is smaller than the second curvature radius a2 corresponding to the second distance r2.

Since the reciprocal of the curvature radius is the curvature, in the present embodiment, it is configured so that the first curvature (1/a1) of the microlens optical system at the first distance r1 is greater than the second curvature (1/a2) of the microlens optical system at the second distance r2.

Further, as shown in 8A, since the microlens optical system is configured under the above conditions, it is configured so that the second focal point z2 corresponding to the second distance r2 is located relatively closer to the photoelectric conversion units 301 and 302 than the first focal point z1 corresponding to the first distance r1.

8B shows an example of light intensity distribution inside a pixel of the present embodiment provided with the microlens optical system shown in 8A when a circularly polarized plane wave (wavelength $\lambda$=540 nm) is incident on the pixel at an angle parallel to the optical axis. Further, 8C shows an example of a convergence spot on the light receiving surface.

8E shows an example of light intensity distribution inside a pixel of the present embodiment provided with the microlens optical system shown in 8D when a circularly polarized plane wave (wavelength $\lambda$=540 nm) is incident on the pixel at an angle of 25° with respect to the optical axis. Further, 8F shows an example of a convergence spot on the light receiving surface.

In this way, when light is incident at an angle of 25° with respect to the optical axis as in 8D, an incident point p1 of a light ray l1 from a point at the first distance r1 on the light receiving surface of the photoelectric conversion unit is farther from the center of the pixel comparing to an incident point p2 of a light lay l2 from a point at the second distance r2 on the light receiving surface of the photoelectric conversion unit. However, the incidence angle of the light ray l1 on the light receiving surface of the photoelectric conversion unit is large, hence crosstalk to adjacent pixels is suppressed. On the contrary, the incidence angle of the light ray l2 from the point at the second distance r2 on the light receiving surface of the photoelectric conversion unit is relatively small with respect to the incidence angle of the light ray l1 from the point at the first distance r1. However, since the incident point p2 of the light ray l2 is relatively close to the center of the pixel away from the adjacent pixels comparing to the incident point p1 of the light ray l1, crosstalk to the adjacent pixel is suppressed.

As described above, each pixel of the image sensor of the present embodiment has a microlens optical system provided on the light receiving side with respect to the photoelectric conversion unit, and has the following two relationships with regard to the first distance r1 from the optical axis of the microlens optical system and the second distance r2, which is longer than the first distance r1.

First, the first curvature of the microlens optical system at the first distance r1 is larger than the second curvature of the microlens optical system at the second distance r2, Further, the first focal point z1 of the microlens optical system corresponding to the first distance r1 is on the light receiving side with respect to the second focal point z2 of the microlens optical system corresponding to the second distance r2.

The photoelectric conversion units 301 and 302 are formed of silicon Si or the like having a large refractive index, and the upper layer of the photoelectric conversion units 301 and 302 is formed of silicon oxide SiOx or the like having a small refractive index. Therefore, before light is incident on the photoelectric conversion units 301 and 302 having a large refractive index, the upper layer of the photoelectric conversion units 301 and 302 having a small refractive index suppresses the spread of light in the direction toward adjacent pixels, thereby it is possible to efficiently suppress crosstalk to the adjacent pixels.

Figure 10:
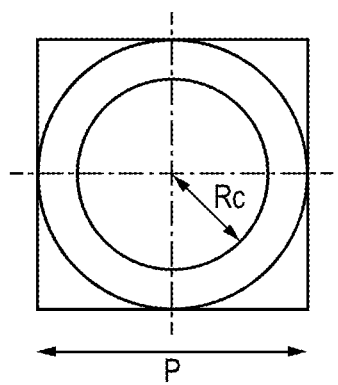
FIG. 10 A diagram for explaining a percentage of a light receiving area of the microlens optical system provided in the pixel according to the first embodiment.

FIG. 10 is a diagram showing a percentage of the light receiving area of the microlens optical system provided in a pixel of the present embodiment.

In order to more effectively suppress crosstalk to adjacent pixels, it is desirable that the intensity of the light ray l1 from the point at the first distance r1 and the intensity of the light ray l2 from the point at the second distance r2 are substantially the same. The radius Rc that divides the area of a circle with a radius of 0.5 P inscribed in the pixel of size P into two equal parts is Rc=0.5 P/√2≈0.35 P. Therefore, with respect to the pixel size P of the pixel, it is desirable that the first distance r1 is in the region inside the radius Rc (0<r1<0.35 P), and the second distance r2 is in the region outside the radius Rc (0.35 P<r2<0.71 P). Further, in the vicinity of the four diagonal corners, the microlens optical system may be shielded from light by a light-shielding layer in order to suppress crosstalk to adjacent pixels. Therefore, it is desirable that the second distance r2 is in the region of 0.35 P<r2≤0.5 P with respect to the pixel size P.

Further, in the vicinity of the optical axis of the microlens optical system, due to an apex (extreme value) shape, the apex may be flattened and the curvature may change or the apex position may vary due to a manufacturing process or the like. In order to suppress this effect, it is desirable that the first distance r1 is in the range of 0.5Rc=0.175 P<r1<0.35 P which excludes an area of a circle with the radius of 0.5Rc about the optical axis (¼ of an area of the circle with radius Rc). Further, since the microlens optical system in the vicinity of the periphery of the pixel is in contact with the microlens optical systems of the adjacent pixels, the curvature may be restricted due to the manufacturing process or the like. In order to suppress this effect, it is desirable that the second distance r2 is within the range of 0.35 P<r2<0.47 P, excluding a ring region from a radius 0.47 P to a radius 0.5 P (i.e., ¼ of the area of the circle with radius Rc) from the region of 0.35 P<r2≤0.5 P.

Further, as shown in 8A of FIG. 8, the angle between the optical axis and a line h1z1 connecting the first principal point h1 and the first focal point z1 of the microlens optical system corresponding to the first distance r1 is denoted by $\phi_1$, and the angle of view of the microlens optical system corresponding to the first distance r1 is denoted by $2\phi_1$. Further, the refractive index at the first focal point z1 is denoted by n. Further, the coordinate along the optical axis is denoted by z. The coordinate z, with the first focal point z1 as the origin (z=0), is expressed as positive on the microlens side, and expressed as negative on the photoelectric conversion unit side.

A first aperture number $NA_1$ of the microlens optical system corresponding to the first distance r1 is defined by the following equation (1).

$$NA_1 = n \cdot \sin \phi_1 \tag{1}$$

Further, a first aperture value $F_1$ of the microlens optical system with the radius of the first distance r1 is defined by the following equation (2).

$$F_1 = 1/(2n \cdot \sin \phi_1) \tag{2}$$

The incident light on a circular portion of the microlens optical system with the radius of the first distance r1 is bent and converged to the first focal point z1 through the circular portion with the radius of the first distance r1. However, due to the wave nature of light, the diameter of a first convergence spot cannot be made smaller than a first diffraction limit $\Delta 1$. When the intensity distribution of the first convergence spot is approximated using the Airy pattern (Airy pattern), the diffraction limit $\Delta_1$ is roughly expressed by the following equation (3), where the wavelength of the incident light is $\lambda$ (wavelength $\lambda$ in the visible light region=380 nm to 780 nm).

$$\Delta_1 = 1.22\lambda/n \cdot \sin \phi_1 = 2.44\lambda F_1 \tag{3}$$

A first depth of focus $\pm z_{D1}$ of the circular portion of the microlens optical system with the radius of the first distance r1 is obtained by the following equation (4), with the diffraction limit $\Delta_1$ as the allowable circle of confusion.

$$\pm z_{D1} = \pm n F_1 \Delta_1 \tag{4}$$

The range of the first depth of focus can be expressed as $z-z_{D1} < z < z_{D1}$ with respect to the coordinate z in the z-axis direction (optical axis direction).

Assuming that the intensity distribution of the first convergence spot is close to the Gaussian distribution, the diameter $w_1$ of the first convergence spot can be substantially expressed as a function of the coordinate z as in the following equation (5).

$$w_1(z) = \Delta_1 \sqrt{\{1+(z/z_{R1})^2\}} \tag{5}$$

Here, $z_{R1}$ is a first Rayleigh length corresponding to the first distance r1, and defined as $z_{R1} = \alpha_R z_{D1}$ with the coefficient $\alpha_R = 0.61\pi \approx 1.92$. In the range of the first Rayleigh length $z-z_{R1} < z < z+z_{R1}$, the diameter $w_1$ of the first convergence spot is greater than or equal to the first diffraction limit $\Delta 1$ and less than or equal to √2 times the first diffraction limit $\Delta_1$ ($\Delta_1 \leq w_1 \leq \sqrt{2}\Delta_1 \approx 1.4\Delta_1$).

The same applies to a second Rayleigh length $z_{R2}$ of the microlens optical system corresponding to the second distance r2 and the range of the second Rayleigh length $z-z_{R2} < z < z+z_{R2}$.

In the present embodiment, the first focal point z1 of the microlens optical system corresponding to the first distance r1 is formed on the front focused side with respect to the light receiving surface of the photoelectric conversion units 301 and 302. Further, in the present embodiment, the first focal point z1 is formed on the front focused side within a range such that the distance between the first focal point z1 of the microlens optical system corresponding to the first distance r1 and the light receiving surface of the photoelectric conversion units 301 and 302 is the first Rayleigh length $z_{R1} \approx 1.92 z_{D1}$ or less. As a result, it is possible to suppress the diameter $w_1$ of the first conversion spot on the light receiving surface of the photoelectric conversion units 301 and 302 of a convergence spot formed by the light flux through the circular portion of the microlens optical system with the radius of the first distance r1 to 1.4 times or less of the first diffraction limit $\Delta_1$ ($w_1 \leq 1.4 \Delta_1$).

In the present embodiment, it is possible to efficiently suppress crosstalk by forming the principal curved surface of the microlens optical system so that the light receiving surface of the photoelectric conversion units 301 and 302 is in the range from the first focal point z1 to the first Rayleigh length, and is in the range of the second focal point z2 to the second Rayleigh length.

As described above, according to the first embodiment, it is possible to efficiently suppress crosstalk to adjacent pixels, thereby it is possible to realize good performance of the on-imaging plane phase difference focus detection and imaging performance at the same time.

Further, crosstalk to adjacent pixels due to obliquely incident light tends to occur in a back-side illuminated image sensor having a wiring layer on the side opposite to the light receiving side with respect to the photoelectric conversion unit than in a front-side illuminated image sensor having a wiring layer on the light receiving side with respect to the photoelectric conversion unit. Therefore, according to the present embodiment, crosstalk to adjacent pixels can be more effectively suppressed in the back-side illuminated image sensor.

Second Embodiment

Next, a second embodiment of the present invention will be described. In the first embodiment described above, the case where the microlens optical system provided in the pixel is composed of one microlens and one intralayer lens has been described. However, the present invention is not limited to this, and a microlens optical system composed of a different number of intralayer lenses from that shown in FIG. 8 may be used.

Figure 11:
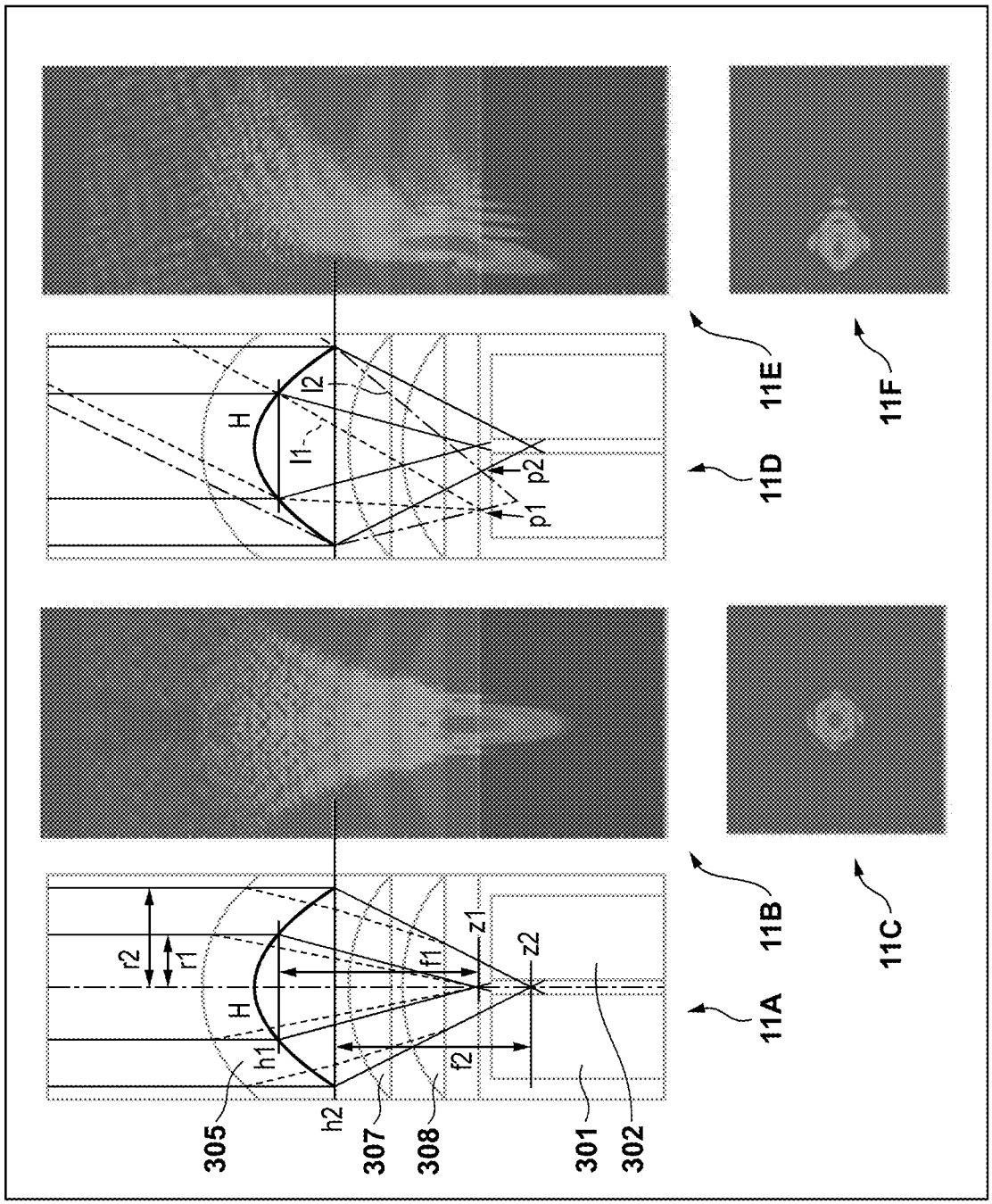
FIG. 11 A diagram for explaining a correspondence between a microlens optical system provided on a pixel and a converged state of light according to a second embodiment.

In 11A to 11F of FIG. 11, the microlens optical system provided in a pixel of the present invention includes one microlens 305 and two intralayer lenses 307 and 308. Other than the above, the present invention is the same as the first embodiment described above, and the principal curved surface H of the microlens optical system having the above configuration is substantially optically equivalent to a single microlens in the shape of the principal curved surface H.

Therefore, according to the second embodiment, the same effect as that of the first embodiment can be obtained.

In the second embodiment, an example of the microlens optical system provided in a pixel including one microlens and two intralayer lenses has been described, but the present invention is not limited thereto. For example, the microlens optical system may be composed of one microlens, or may include one microlens and three or more intralayer lenses.

Third Embodiment

Next, a third embodiment of the present invention will be described. In the embodiment described above, a case where the image sensor is a back-side illuminated image sensor has been described. However, the present invention is not limited to this, and a front-side illuminated image sensor may be used.

Figure 12:
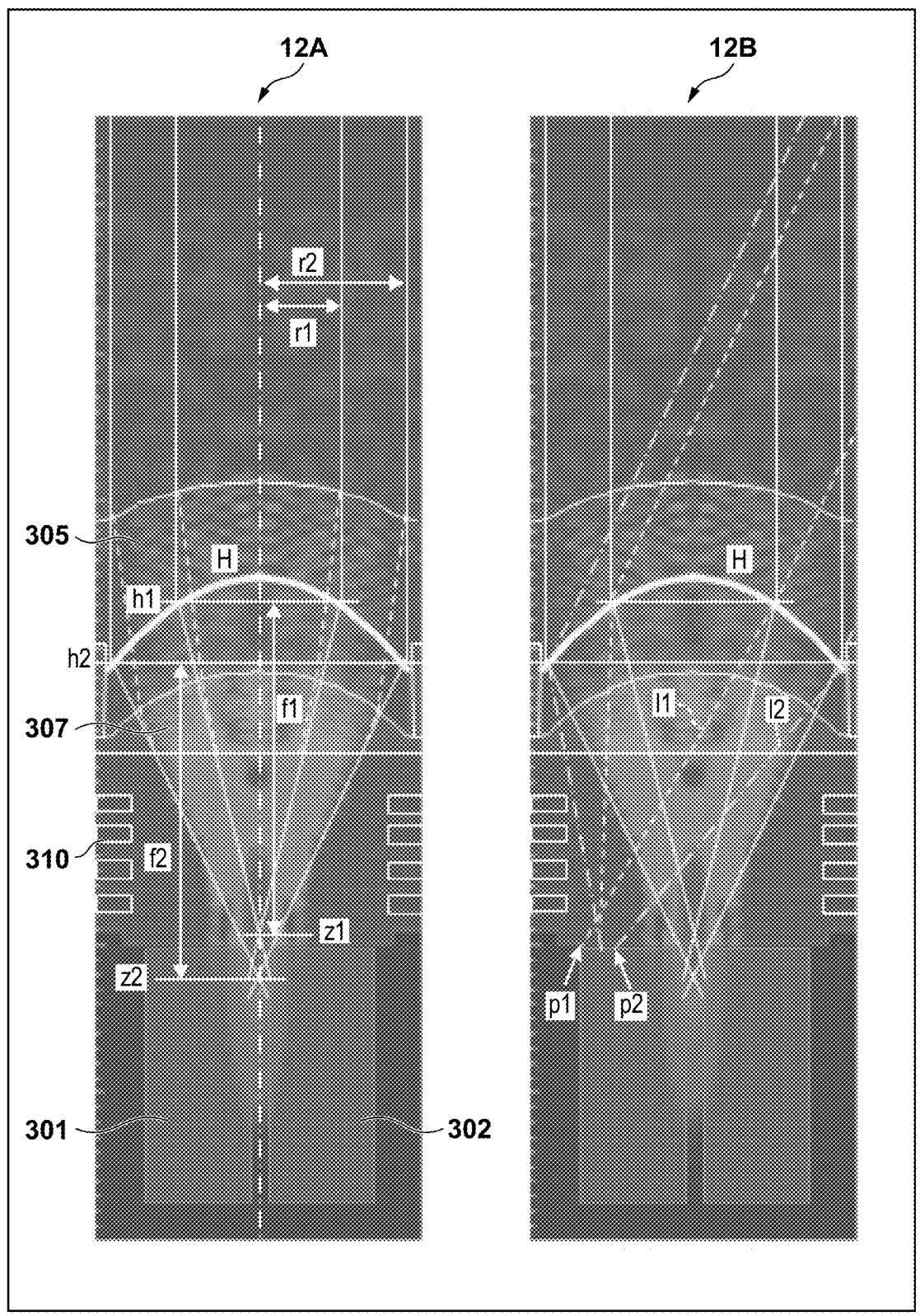
FIG. 12 A diagram for explaining a correspondence between microlens optical system provided on a pixel and a converged state of light according to a third embodiment.

In 12A and 12B of FIG. 12, a microlens optical system having the principal curved surface H shown in FIG. 8 is configured in each pixel of the front-side illuminated image sensor. A wiring layer 310 is provided on the light receiving side with respect to the photoelectric conversion units 301 and 302. Other than the above, the structure is the same as that of the first embodiment described above.

Therefore, according to the third embodiment, the same effect as that of the first embodiment can be obtained.

Fourth Embodiment

Next, a fourth embodiment of the present invention will be described. In the first embodiment described above, the case where each pixel of the image sensor 107 is divided into two in the x direction and one in the y direction (that is, not divided) has been described. However, the present invention is not limited to this, and an image sensor 107 composed of pixels each having a different number of divisions and a different division method from that shown in FIG. 2 may be used.

Figure 13:
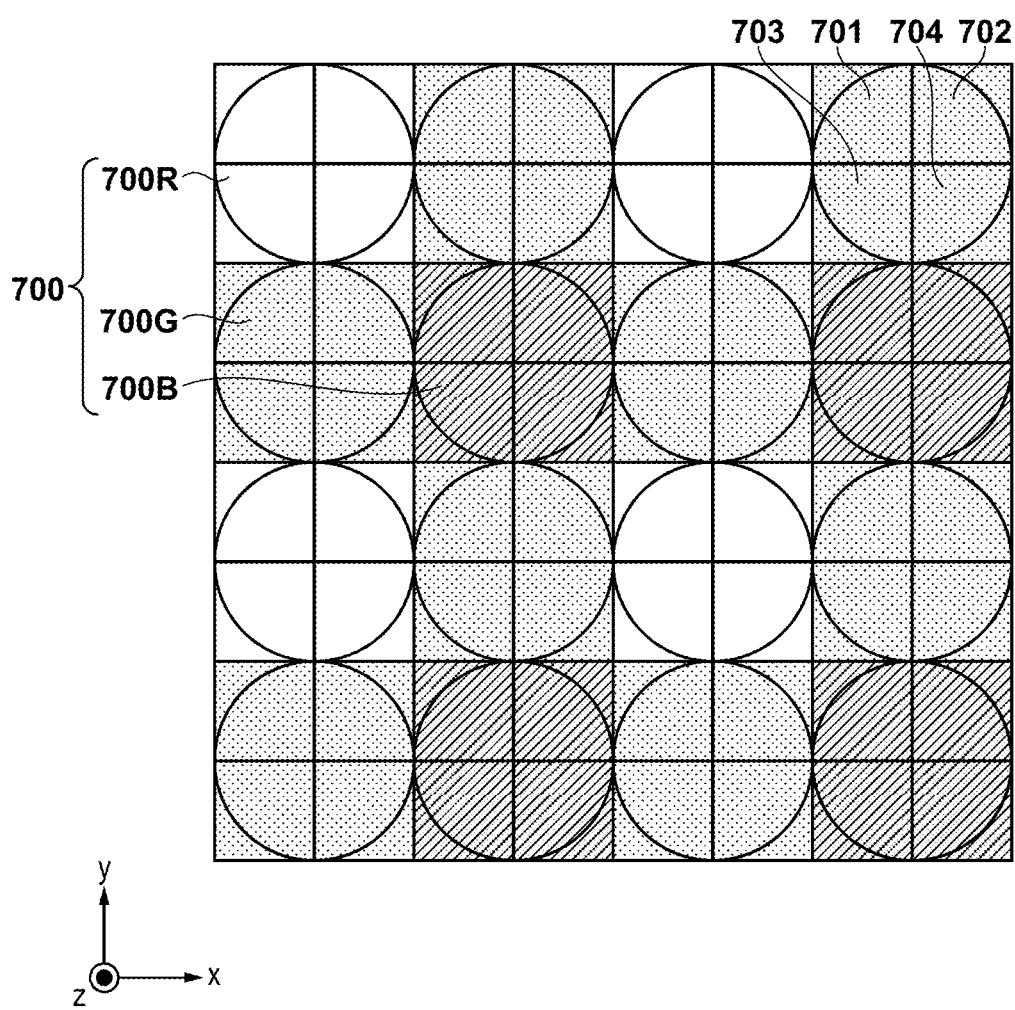
FIG. 13 A schematic view showing an example of a pixel array according to a fourth embodiment.

FIG. 13 is a diagram showing an outline of an arrangement of imaging pixels and focus detection pixels of the image sensor 107 used in the present embodiment. FIG. 13 illustrates the pixel (imaging pixel) array within the range of 4 columns×4 rows, or the focus detection pixel array within the range of 8 columns×8 rows in the two-dimensional CMOS sensor (image sensor).

In the present embodiment, a pixel group 700 shown in FIG. 13 includes pixels of 2 rows×2 columns, and a pixel 700R having a spectral sensitivity of R (red) is arranged at the upper left position, pixels 700G having a spectral sensitivity of G (green) are arranged at the upper right and lower left positions, and a pixel 700B having a spectral sensitivity of B (blue) is arranged at the lower right position. Further, each pixel is formed from a first focus detection pixel 701 to a fourth focus detection pixel 704 arrayed in 2 columns×2 rows.

A large number of arrays of 4 columns×4 rows of pixels (8 columns×8 rows of focus detection pixels) shown in FIG. 13 are arranged on a plane to enable capture of an image (focus detection signals).

Figure 14:
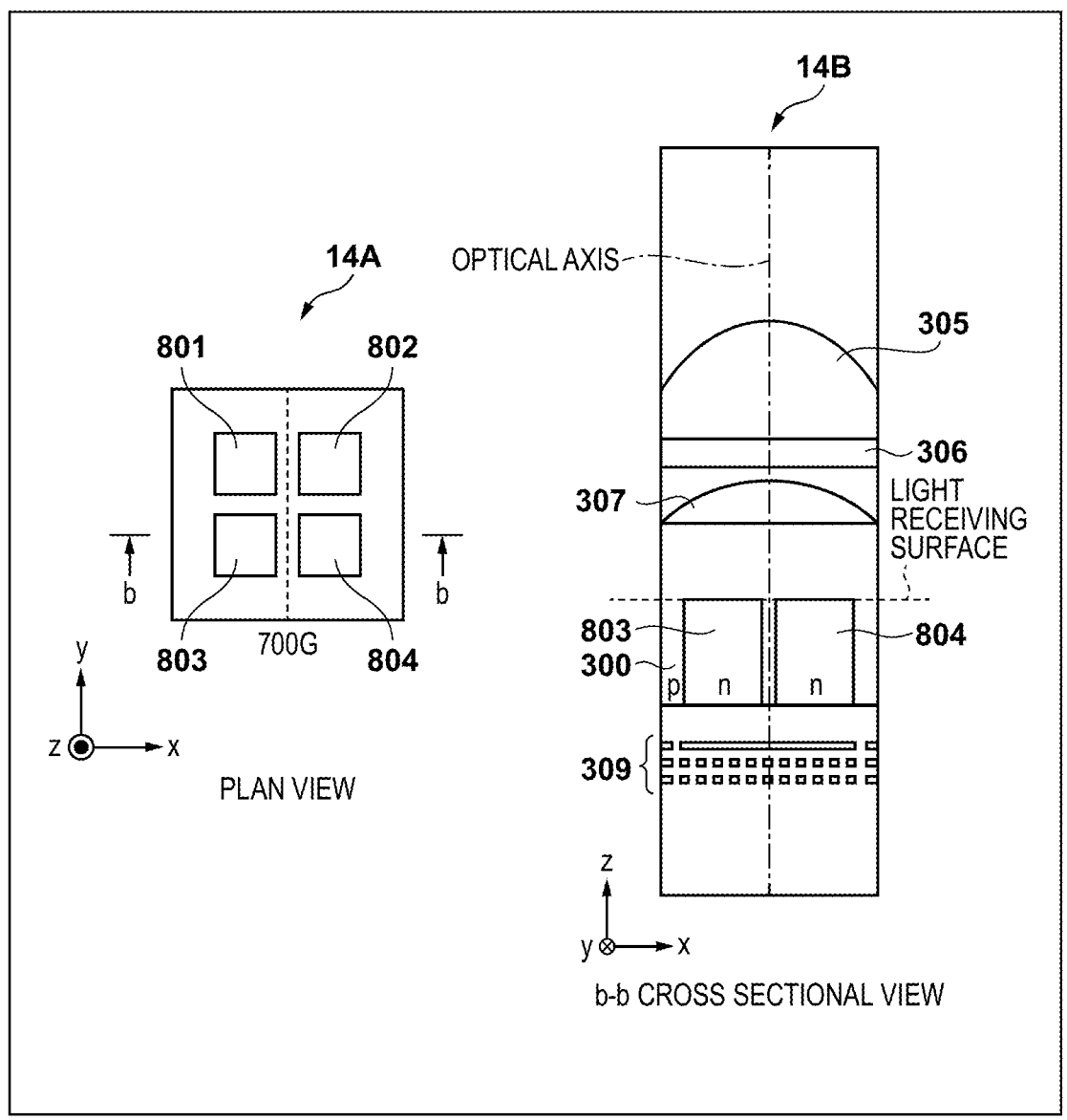
FIG. 14 A schematic plan view and a schematic cross-sectional view of a pixel according to the fourth embodiment.

14A of FIG. 14 is a plan view of one pixel 700G of the image sensor 107 shown in FIG. 13 when viewed from the light receiving surface side (+z side) of the image sensor 107, and 14B of FIG. 14 is a cross-sectional view taken along a b-b line in 14A viewed from the −y side. As shown in FIG. 14, in the pixel 700G according to this embodiment, a microlens 305 and an intralayer lens 307 for converging incident light is formed on the light receiving side of each pixel, and a first photoelectric conversion unit 801 to a fourth photoelectric conversion unit 804 that divide the pixel by NH (here, divided by two) in the x direction and by NV (here, divided by two) in the y direction are formed. The first photoelectric conversion unit 801 to the fourth photoelectric conversion unit 804 correspond to the first focus detection pixel 701 to the fourth focus detection pixel 704, respectively.

With such a configuration, by adding the signals of the first focus detection pixel 701 and the third focus detection pixel 703, and by adding the signals of the second focus detection pixel 702 and the fourth focus detection pixel 704 in each pixel and reading out the added signals, it is possible to obtain signals similar to the signals from the first focus detection pixel 201 and the second focus detection pixel 202 in FIG. 2. Further, by adding the light-received signals of the first focus detection pixel 701 and the second focus detection pixel 702, and by adding the light-received signals of the third focus detection pixel 703 and the fourth focus detection pixel 704 in each pixel and reading out the added signals, it is possible to obtain focus detection signals whose division direction is the vertical direction. When used as an image signal, the signals of the first to fourth focus detection pixels 701 to 704 may be added. Further, a pair of focus detection signals and an image signal may be obtained by reading out a part of the signals of the first to fourth focus detection pixels 701 to 704 and a signal obtained by adding the signals of the first to fourth focus detection pixels 701 to 704, and taking a difference between them. Other than the above, the present embodiment is the same as the above-described embodiment.

With the above configuration, according to the fourth embodiment, the same effect as that of the first embodiment can be obtained.

Fifth Embodiment

Next, a fifth embodiment of the present invention will be described. In the first to fourth embodiments described above, a configuration example of the microlens optical system having the shape of the principal curved surface H shown in FIG. 8 has been described. However, the present invention is not limited to this, and the principal curved surface of the microlens optical system may have a shape different from that of the first embodiment. In the fifth embodiment, in order to suppress inter-pixel crosstalk and at the same time secure a phase difference focus detection signals, an example of the configuration in which a certain amount of intra-pixel crosstalk between the photoelectric conversion unit 301 and the photoelectric conversion unit 302 in a pixel preferably occurs will be described.

Figure 15:
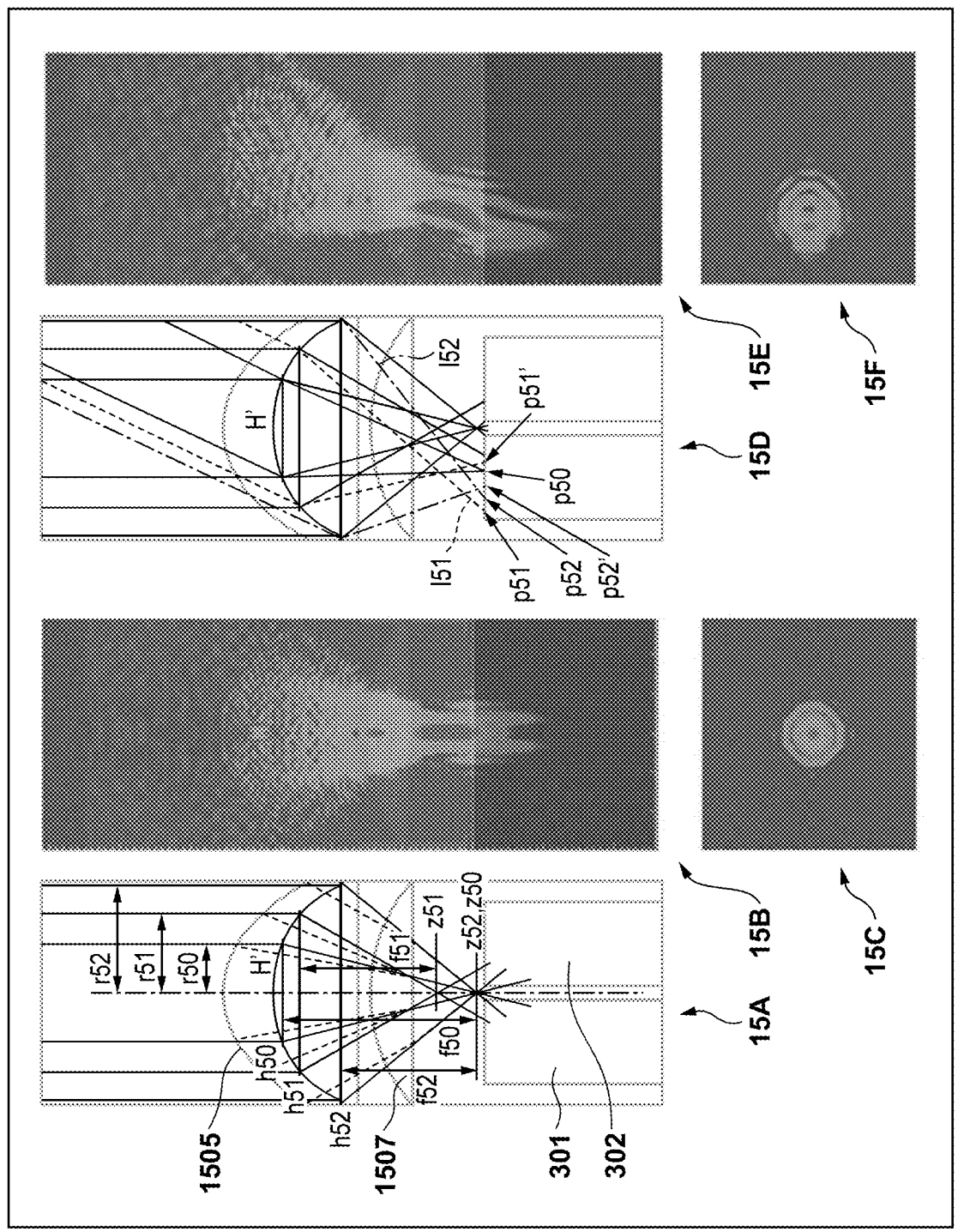
FIG. 15 A diagram for explaining a correspondence between a microlens optical system provided on a pixel and a converged state of light according to a fifth embodiment.

In 15A to 15F of FIG. 15, the microlens optical system provided in the pixel of the present invention is composed of one microlens 1505 having a shape different from that of the first embodiment and one intralayer lens 1507. In the image sensor shown in FIG. 15, the same reference numerals are given to the same configurations as those of the pixels shown in FIG. 3, and the description thereof will be omitted.

15A to 15C of FIG. 15 show a state in which light incident on a pixel of the present embodiment at an angle parallel to the optical axis is converged by the microlens optical system provided on the light receiving side of the photoelectric conversion units 301 and 302. Further, 15D to 15F of FIG. 15 show a state in which light incident on a pixel of the present embodiment at an angle of 25° with respect to the optical axis is converged by the microlens optical system provided on the light receiving side of the photoelectric conversion units 301 and 302.

The microlens optical system in the present embodiment is composed of a microlens 1505, a planarizing layer, a color filter, an intralayer lens 1507, a sealing layer, an insulating layer, and so forth.

In 15A and 15D of FIG. 15, a curve H' shown by a bold line indicates a principal curved surface H' (cross section) of the microlens optical system provided in the pixel of the present embodiment, and the microlens optical system is optically equivalent to a single microlens having the principal curved surface H'. Therefore, the pixel of the present embodiment is substantially optically equivalent to a pixel structure in which a single microlens having the principal curved surface H' is provided on the light receiving side of the photoelectric conversion units 301 and 302.

In 15A, a zeroth distance from the optical axis of the microlens optical system is denoted by r50, a first distance from the optical axis of the microlens optical system is denoted by r51, and a second distance from the optical axis of the microlens optical system is denoted by r52. The magnitude relationship between the zeroth distance r50, the first distance r51 and the second distance r52 is, on the radial coordinates with the optical axis of the microlens optical system being the center, the zeroth distance r50<the first distance r51<the second distance r52, and a position at the zeroth distance r50 is close to the center, a position at the first distance r51 is in an intermediate range, and a position at the second distance r52 is close to the periphery.

With respect to the zeroth distance r50, a point on the principal curved surface H' of the microlens optical system is referred to as a zeroth principal point h50, the focal length is referred to as a zeroth focal length f50, and the focal point is referred to as the zeroth focal point z50. Further, with respect to the first distance r51, a point on the principal curved surface of the microlens optical system is referred to as a first principal point h51, the focal length is referred to as a first focal length f51, and the focal point is referred to as the first focal point z51. Furthermore, with respect to the second distance r52, a point on the principal curved surface of the microlens optical system is referred to as a second principal point h52, the focal length is referred to as a second focal length f52, and the focal point is referred to a second focal point z52.

In the present embodiment, a first curvature of the microlens optical system at the first distance r51 is configured to be larger than a second curvature of the microlens optical system at the second distance r52.

As shown in 15A, since the microlens optical system is configured under the above conditions, the second focal point z52 corresponding to the second distance r52 becomes closer to the photoelectric conversion units 301 and 302 than the first focal point z51 corresponding to the first distance r51.

15B shows an example of light intensity distribution inside a pixel of the present embodiment provided with the microlens optical system shown in 15A when a circularly polarized plane wave (wavelength λ=540 nm) is incident on the pixel at an angle parallel to the optical axis. Further, 15C shows an example of a convergence spot on the light receiving surface.

In the above configuration, when light is incident at an angle of 25° with respect to the optical axis as in 15D, an incident point p51 of the light ray l51 from a point at the first distance r51 on the light receiving surface of the photoelectric conversion unit is farther from the center of the pixel comparing to an incident point p52 of a light ray l52 from a point at the second distance r52. However, since the incidence angle of the light ray l51 on the light receiving surface of the photoelectric conversion unit is large, crosstalk to adjacent pixels is suppressed. On the contrary, the incidence angle of the light ray l52 from the point at the second distance r52 on the light receiving surface of the photoelectric conversion unit is relatively small with respect to the incidence angle of the light ray l51 from the point at the first distance r51. However, since the incident point p52 of the light ray l52 is relatively close to the center of the pixel away from the adjacent pixel comparing to the incident point p51 of the light ray l51, crosstalk to the adjacent pixel is suppressed.

Now, a first radius $Rc1=0.5\ P/\sqrt{3}\approx0.29\ P$ and a second radius $Rc2=0.5\ P/\sqrt{3}\times\sqrt{2}\approx0.41\ P$ divide the area of a circle with a radius 0.5 P inscribed in the pixel having a size P into three equal parts. In order to more effectively suppress crosstalk to adjacent pixels, it is desirable that the intensity of the light ray from the point at the zero distance r50, the intensity of the light ray from the point at the first distance r51 and the intensity of the light ray from the point at the second distance r52 are substantially the same. Therefore, it is configured such that the zeroth distance r50 is in the region in the radius Rc1 (0<the zeroth distance r50<0.29 P), the first distance r51 is in the region between the radius Rc1 and the radius Rc2 (0.29 P<the first distance r51<0.41 P), and the second distance r52 is in the region outside the radius Rc2 (0.41 P<the second distance r52<0.71 P). Further, in the vicinity of the four diagonal corners, the microlens optical system may be shielded from light by a light-shielding layer in order to suppress crosstalk to adjacent pixels. Therefore, it is desirable that the second distance r52 is in the region between 0.41 P<the second distance r52≤0.5 P with respect to the pixel size P. Further, in the vicinity of the optical axis of the microlens optical system, due to an apex (extreme value) shape, the apex may be flattened and the curvature may change or the apex position may vary due to a manufacturing process or the like. In order to suppress this effect, it is desirable that the zeroth distance r50 is in the range of 0.5Rc1=0.145 P<the zeroth distance r50<0.29 P, excluding an area of a circle with the radius of 0.5Rc1 about the optical axis (¼ of an area of the circle with radius Rc1). Further, since the microlens optical system in the vicinity of the periphery of the pixel is in contact with the microlens optical systems of the adjacent pixels, the curvature may be restricted due to the manufacturing process or the like. In order to suppress this effect, it is desirable that the second distance r52 is within the range of 0.41 P<the second distance r52<0.48 P, excluding a ring region from the radius of 0.48 P to the radius of 0.5 P (i.e., ¼ of the area of the circle with radius Rc1) from the region of 0.41 P<the second distance r52≤0.5 P.

The photoelectric conversion units 301 and 302 are formed of silicon Si or the like having a large refractive index, and the upper layer of the photoelectric conversion units 301 and 302 is formed of silicon oxide SiOx or the like having a small refractive index. Therefore, before light is incident on the photoelectric conversion units 301 and 302 having a large refractive index, the upper layer of the photoelectric conversion units 301 and 302 having a small refractive index suppresses the spread of light in the direction toward adjacent pixels, thereby it is possible to efficiently suppress crosstalk to the adjacent pixels.

As described above, the pixel of the image sensor of the present embodiment has a microlens optical system provided on the light receiving side with respect to the photoelectric conversion unit, and has the following two relationships with regard to the first distance r51 from the optical axis of the microlens optical system and the second distance r52, which is longer than the first distance r51.

First, the first curvature of the microlens optical system at the first distance r51 is larger than the second curvature of the microlens optical system at the second distance r52. Further, the first focal point z51 of the microlens optical system corresponding to the first distance r51 is on the light receiving side with respect to the second focal point z52 of the microlens optical system corresponding to the second distance r52.

Further, in the present embodiment, in addition to the configuration for suppressing the inter-pixel crosstalk described above, in order to preferably generate a certain amount of intra-pixel crosstalk between the photoelectric conversion unit 301 and the photoelectric conversion unit 302 in a pixel so as to secure phase difference focus detection signals, the pixel is designed to satisfy the following conditions.

As shown in 15A, in the present embodiment, the zeroth curvature of the microlens optical system at the zeroth distance r50 is designed to be smaller than the first curvature of the microlens optical system at the first distance r51.

Further, as shown in 15A, in the present embodiment, the zeroth focal length f50 of the microlens optical system corresponding to the zeroth distance r50 is designed to be longer than the first focal length f51 of the microlens optical system corresponding to the first distance r51.

Further, as shown in 15A, in the present embodiment, the zeroth focal point z50 of the microlens optical system corresponding to the zeroth distance r50 is se relatively closer to the photoelectric conversion units 301 and 302 than the first focal point z51 of the microlens optical system corresponding to the first distance r51. Further, the distance from the light receiving surface of the photoelectric conversion units 301 and 302 to the first focal point z51 is set longer than the distance from the light receiving surface of the photoelectric conversion units 301 and 302 to the zeroth focal point z50, and the distance from the light receiving surface of the photoelectric conversion units 301 and 302 to the second focal point z52.

Further, as shown in 15A, the angle between the optical axis and a line h51z51 connecting the first principal point h51 and the first focal point z51 of the microlens optical system corresponding to the first distance r51 is denoted by $\phi_1$, and the angle of view of the microlens optical system corresponding to the first distance r51 is denoted by $2\phi_1$. Further, the refractive index at the first focal point z51 is denoted by n. Further, the coordinate along the optical axis is denoted by z. The coordinate z, with the first focal point z51 as the origin (z=0), is expressed as positive on the microlens side, and expressed as negative on the photoelectric conversion unit side.

A first aperture number $NA_1$ of the microlens optical system corresponding to the first distance r51 is defined by the following equation (1).

$$NA_1 = n \cdot \sin \phi_1 \quad (1)$$

Further, a first aperture value $F_1$ of the microlens optical system with the radius of the first distance r51 is defined by the following equation (2).

$$F_1 = 1/(2n \cdot \sin \phi_1) \quad (2)$$

The incident light on a circular portion of the microlens optical system with the radius of the first distance r51 is bent and converged to the first focal point z51 through the circular portion with the radius of the first distance r51. However, due to the wave nature of light, the diameter of the first convergence spot cannot be made smaller than a first diffraction limit $\Delta_1$. When the intensity distribution of the first convergence spot is approximated using the Airy pattern (Airy Attern), the diffraction limit $\Delta_1$ is roughly expressed by the following equation (3), where the wavelength of the incident light is $\lambda$ (wavelength $\lambda$ in the visible light region=380 nm to 780 nm).

$$\Delta_1 = 1.22\lambda/n \cdot \sin \phi_1 = 2.44\lambda F_1 \quad (3)$$

A first depth of focus $\pm z_{D1}$ of the circular portion of the microlens optical system with the radius of the first distance r51 is obtained by the following equation (4), with the diffraction limit $\Delta_1$ as the allowable circle of confusion.

$$\pm z_{D1} = \pm nF_1\Delta_1 \quad (4)$$

The range of the first depth of focus can be expressed as $z-z_{D1} \leq z \leq z+z_{D1}$ with respect to the coordinate z in the z-axis direction (optical axis direction).

Assuming that the intensity distribution of the first convergence spot is close to the Gaussian distribution, the diameter $w_1$ of the first convergence spot can be substantially expressed as a function of the coordinate z as in the following equation (5).

$$w_1(z) = \Delta_1 \sqrt{\{1+(z/z_{R1})^2\}} \quad (5)$$

Here, $z_{R1}$ is a first Rayleigh length corresponding to the first distance r51, and defined as $z_{R1} = \alpha_R z_{D1}$ with the coefficient $\alpha_R = 0.61\pi \approx 1.92$. In the range of the first Rayleigh length $z-z_{R1} \leq z \leq z+z_{R1}$, the diameter $w_1$ of the first convergence spot is greater than or equal to the first diffraction limit $\Delta_1$ and less than or equal to $\sqrt{2}$ times the first diffraction limit $\Delta_1$ ($\Delta_1 \leq w_1 \leq \sqrt{2}\Delta_1 \approx 1.4\Delta_1$).

The same applies to a second Rayleigh length $z_{R2}$ of the microlens optical system corresponding to the second distance r52 and to the range of the second Rayleigh length $z-z_{R2} \leq z \leq z+z_{R2}$.

The same applies to a zeroth Rayleigh length $z_{R0}$ of the microlens optical system corresponding to the zeroth distance r50 and to the range of the zeroth Rayleigh length $z-z_{R0} \leq z \leq z+z_{R0}$.

In the present embodiment, the first focal point z51 of the microlens optical system corresponding to the first distance r51 is formed on the front focused side with respect to the light receiving surface of the photoelectric conversion units 301 and 302. Further, in the present embodiment, the first focal point z51 is formed on the front focused side within a range such that the distance between the first focal point z51 of the microlens optical system corresponding to the first distance r51 and the light receiving surface of the photoelectric conversion units 301 and 302 is the first Rayleigh length $z_{R1} \approx 1.92 z_{D1}$ or less. As a result, it is possible to suppress the diameter $w_1$ of the first conversion spot on the light receiving surface of the photoelectric conversion units 301 and 302 of a convergence spot formed by the light flux through the circular portion of the microlens optical system with the radius of the first distance r51 to 1.4 times or less of the first diffraction limit $\Delta_1$ ($w_1 \leq 1.4\Delta_1$).

In the present embodiment, it is possible to efficiently suppress crosstalk by forming the principal curved surface of the microlens optical system so that the light receiving surface of the photoelectric conversion units 301 and 302 is in the range from the first focal point z51 to the first Rayleigh length, and is in the range from the second focal point z52 to the second Rayleigh length. In addition, forming the principal curved surface of the microlens optical system so that the light receiving surface of the photoelectric conversion units 301 and 302 is in the range from the zeroth focal point z50 to the zeroth Rayleigh length, it is possible to further efficiently suppress crosstalk.

With the above configuration, as shown in 15D, when light is incident at an angle of 25° with respect to the optical axis, the light flux from the circular portion of the microlens optical system with the radius of the first distance r51 spreads in the range from the incident point p51 to the incident point p51' with a first diffraction limit $\Delta_1$ to 1.4$\Delta_1$ on the light receiving surface of the photoelectric conversion unit. On the other hand, the zeroth incident point p50 which the light flux from the circular portion of the microlens optical system with the radius of the zeroth distance r50 is converged to and incident on, and an area from the second incident point p52 to a second incident point p52' where the light flux from the circular portion of the microlens optical system with the radius of the second distance r52 spreads are both included in an area from the incident point p51 to an incident point p51', which is an area of the light flux from the circular portion of the microlens optical system with the radius of the first distance r51. Therefore, it is possible to keep the convergence spot diameter of a convergence spot on the light receiving surface of the photoelectric conversion units 301 and 302 formed from all light flux incident on the microlens optical system to 1.4 times or less of the first diffraction limit $\Delta_1$ ($w_1 \leq 1.4\Delta_1$), and it is possible to keep good pupil separation performance.

Further, according to the above configuration, a part of the light flux from the circular portion of the microlens optical system with the radius of the first distance r51 spreads to the incident point p51' in the radial direction from the center of the pixel on the light receiving surface of the photoelectric conversion unit, so that a certain amount of intra-pixel crosstalk occurs between the photoelectric conversion unit 301 and the photoelectric conversion unit 302 in the pixel. The amount of intra-pixel crosstalk can be suitably adjusted by adjusting the amount of front focus amount of light of the first focal point z51 from the light receiving surface of the photoelectric conversion units 301 and 302. Therefore, in the present embodiment, the inter-pixel crosstalk is suppressed, and at the same time, the pupil separation performance is well maintained, and a certain amount of intra pixel crosstalk between the photoelectric conversion unit 301 and the photoelectric conversion unit 302 in the pixel preferably occurs. Accordingly, even if the light receiving amount is biased to either the photoelectric conversion unit 301 or the photoelectric conversion unit 302 depending on the conditions of the imaging optical system, the minimum amount of light required for the phase difference focus detection signals are secured.

15E shows an example of light intensity distribution inside a pixel of the present embodiment provided with the microlens optical system shown in 15D when a circularly polarized plane wave (wavelength $\lambda$=540 nm) is incident on the pixel at an angle of 25° with respect to the optical axis. Further, 15F shows an example of a convergence spot on the light receiving surface.

As described above, according to the fifth embodiment, crosstalk to adjacent pixels can be effectively suppressed, and at the same time, the minimum amount of light received as phase difference focus detection signals can be secured. This makes it possible to achieve both good performance of the on-imaging plane phase difference focus detection and good imaging performance.

According to the present invention, crosstalk between pixels can be suppressed while maintaining focus detection performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image sensor having a plurality of pixels including focus detection pixels that outputs signals from which a pair of focus detection signals having parallax can be obtained based on light flux passing through different pupil regions of an imaging optical system, each pixel comprising:

at least one photoelectric conversion unit; and
a microlens optical system provided on a side on which light is incident with respect to the photoelectric conversion unit,
wherein each microlens of the microlens optical system only covers two photoelectric conversion units in both an X direction and a Y direction of an imaging plane, and
wherein the microlens optical system has one principal curved surface and a shape of the principal curved surface of the microlens optical system is a circle in plan view and such that a first focal point of a circular portion of the microlens optical system with a radius of a first distance from an optical axis of the microlens optical system is located on the side where the light enters with respect to a second focal point of a circular portion of the microlens optical system with a radius of a second distance which is farther from the optical axis of the microlens optical system than the first distance.

2. The image sensor according to claim 1, wherein the shape of the principal curved surface of the microlens optical system is such that the first focal point of the circular portion of the microlens optical system with the radius of the first distance from the optical axis of the microlens optical system is located on the side where the light enters with respect to a third focal point of a circular portion of the microlens optical system with a radius of a third distance which is closer to the optical axis of the microlens optical system than the first distance.

3. The image sensor according to claim 1, wherein:
let a pixel size of the pixel be P, the first distance be r1, and the second distance be r2, then $$r1 < 0.35\ P < r2$$

holds.

4. The image sensor according to claim 3, wherein:
let the pixel size of the pixel be P, the second distance be r2, then $$r2 \leq P$$

holds.

5. The image sensor according to claim 2, wherein:
let a pixel size of the pixel be P, the first distance be r1, the second distance be r2, and the third distance be r0, then $$0 \leq r0 < 0.29\ P \leq r1 < 0.41\ P < r2 \leq 0.5\ P$$

holds.

6. The image sensor according to claim 1, wherein diameters of convergence spots formed with light flux passing through circular portions of the microlens optical system with radii of a plurality of distances from the optical axis of the microlens optical system are respectively included in depths of focus of the microlens optical system corresponding to the plurality of distances, respectively.

7. The image sensor according to claim 1, wherein the microlens optical system includes one microlens.

8. The image sensor according to claim 1, wherein the microlens optical system includes one microlens and one or more intralayer lenses.

9. The image sensor according to claim 1, wherein the each pixel further comprises a wiring layer provided on an opposite side of the side on which light is incident.

10. The image sensor according to claim 1, wherein the each pixel further comprises a wiring layer provided on a side on which light is incident.

11. An image capturing apparatus comprising:
an image sensor having a plurality of pixels including focus detection pixels that outputs signals from which a pair of focus detection signals having parallax can be obtained based on light flux passing through different pupil regions of an imaging optical system, each pixel comprising:
at least one photoelectric conversion unit; and
a microlens optical system provided on a side on which light is incident with respect to the photoelectric conversion unit,
wherein each microlens of the microlens optical system only covers two photoelectric conversion units in both an X direction and a Y direction of an imaging plane, and
wherein the microlens optical system has one principal curved surface and a shape of the principal curved surface of the microlens optical system is a circle in plan view and such that a first focal point of a circular portion of the microlens optical system with a radius of a first distance from an optical axis of the microlens optical system is located on the side where the light enters with respect to a second focal point of a circular portion of the microlens optical system with a radius of a second distance which is farther from the optical axis of the microlens optical system than the first distance;
the imaging optical system; and
a processing unit that processes signals output from the image sensor.

12. An image capturing apparatus to/from which an imaging optical system can be attached/detached, comprising:
an image sensor having a plurality of pixels including focus detection pixels that outputs signals from which a pair of focus detection signals having parallax can be obtained based on light flux passing through different pupil regions of an imaging optical system, each pixel comprising:
at least one photoelectric conversion unit; and
a microlens optical system provided on a side on which light is incident with respect to the photoelectric conversion unit,
wherein each microlens of the microlens optical system only covers two photoelectric conversion units in both an X direction and a Y direction of an imaging plane, and
wherein the microlens optical system has one principal curved surface and a shape of the principal curved surface of the microlens optical system is a circle in plan view and such that a first focal point of a circular portion of the microlens optical system with a radius of a first distance from an optical axis of the microlens optical system is located on the side where the light enters with respect to a second focal point of a circular portion of the microlens optical system with a radius of a second distance which is farther from the optical axis of the microlens optical system than the first distance; and
a processing unit that processes signals output from the image sensor.

* * * * *